United States Patent
Wong et al.

(10) Patent No.: US 9,548,200 B2
(45) Date of Patent: Jan. 17, 2017

(54) VARIABLE FREQUENCY MICROWAVE (VFM) PROCESSES AND APPLICATIONS IN SEMICONDUCTOR THIN FILM FABRICATIONS

(71) Applicant: Applied Materials, Inc., Santa Clara, CA (US)

(72) Inventors: Loke Yuen Wong, Singapore (SG); Ke Chang, Singapore (SG); Yueh Sheng Ow, Singapore (SG); Ananthkrishna Jupudi, Milpitas, CA (US); Glen T. Mori, Gilroy, CA (US); Aksel Kitowski, Singapore (SG); Arkajit Roy Barman, Singapore (SG)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/322,484

(22) Filed: Jul. 2, 2014

(65) Prior Publication Data

US 2015/0056819 A1 Feb. 26, 2015

Related U.S. Application Data

(60) Provisional application No. 61/868,108, filed on Aug. 21, 2013, provisional application No. 61/868,110, filed on Aug. 21, 2013.

(51) Int. Cl.
*H01L 21/31* (2006.01)
*H01L 21/02* (2006.01)
*H01L 21/3105* (2006.01)
*H01L 21/67* (2006.01)

(52) U.S. Cl.
CPC ..... *H01L 21/02345* (2013.01); *H01L 21/0234* (2013.01); *H01L 21/02118* (2013.01); *H01L 21/31058* (2013.01); *H01L 21/67115* (2013.01)

(58) Field of Classification Search
CPC .............. H01L 21/02345; H01L 21/02203
USPC ........................................................ 438/781
See application file for complete search history.

(56) References Cited

U.S. PATENT DOCUMENTS

| | | | | |
|---|---|---|---|---|
| 5,738,915 A | * | 4/1998 | Fathi et al. | 427/487 |
| 5,972,184 A | * | 10/1999 | Hollars | H01J 37/3405 |
| | | | | 204/298.03 |
| 6,358,570 B1 | * | 3/2002 | Affinito | B05D 3/0493 |
| | | | | 427/384 |
| 7,557,035 B1 | * | 7/2009 | Ryan et al. | 438/638 |
| 7,892,985 B1 | * | 2/2011 | Cho et al. | 438/781 |
| 8,298,747 B2 | * | 10/2012 | Minegishi et al. | 430/270.1 |
| 8,758,977 B2 | * | 6/2014 | Minegishi | 430/270.1 |
| 2005/0122455 A1 | | 6/2005 | Watanabe et al. | |
| 2005/0183960 A1 | * | 8/2005 | Andideh et al. | 205/123 |

(Continued)

OTHER PUBLICATIONS

International Search report and Written Opinion for related PCT application No. PCT/US2014/045212 dated Oct. 27, 2014.

*Primary Examiner* — Reema Patel
*Assistant Examiner* — Syed Gheyas
(74) *Attorney, Agent, or Firm* — Patterson & Sheridan, LLP

(57) ABSTRACT

Methods and apparatus for processing a substrate are described herein. A vacuum multi-chamber deposition tool can include a degas chamber with both a heating mechanism and a variable frequency microwave source. The methods described herein use variable frequency microwave radiation to increased quality and speed of the degas process without damaging the various components.

18 Claims, 14 Drawing Sheets

(56) References Cited

U.S. PATENT DOCUMENTS

| | | | |
|---|---|---|---|
| 2006/0223903 A1 | 10/2006 | Cao et al. | |
| 2008/0113283 A1 | 5/2008 | Ghoshal et al. | |
| 2012/0070685 A1* | 3/2012 | Kloss et al. | 428/626 |
| 2012/0130014 A1 | 5/2012 | Gaeta et al. | |
| 2013/0309436 A1* | 11/2013 | Vanimisetti et al. | 428/57 |
| 2014/0291141 A1* | 10/2014 | Salsman | C23C 14/3464 204/192.17 |
| 2015/0056819 A1* | 2/2015 | Wong | H01L 21/02345 438/781 |

* cited by examiner

VARIABLE FREQUENCY MICROWAVE (VFM) PROCESSES AND APPLICATIONS IN SEMICONDUCTOR THIN FILM FABRICATIONS

CROSS-REFERENCE TO RELATED APPLICATIONS

This application claims benefit of U.S. Provisional Patent Application Ser. No. 61/868,108 (APPM/20799L), filed Aug. 21, 2013, and of U.S. Provisional Patent Application Ser. No. 61/868,110 (APPM/20999L), filed Aug. 21, 2013. Both are herein incorporated by reference.

BACKGROUND

Field

Embodiments described herein generally relate to apparatus and methods for substrate processing using microwave radiation.

Description of the Related Art

Thin films are the major components of semiconductor devices. Typical thin films used in the semiconductor industry can be in the form of porous dielectrics, low resistance metals, polymeric materials and high-k dielectrics. During flip chip and wafer level packaging, large quantities of polymers are patterned and used as repassivation layers prior to the Under-Bump Metallization (UBM) or redistribution layer (RDL) metallization element. Another example are the highly porous low-k dielectrics, widely used as inter-metal dielectric films in high performance semiconductor devices.

A typical process flow after the developing of a patterned polymer films includes curing of the film and subsequent PVD deposition of the UBM/RDL. In typical processing, polymeric film curing and PVD barrier seed deposition are carried out on separate equipment. The curing process is typically done thermally in conventional oven. This introduces a vacuum break between the processes, resulting in moisture adsorption in the polymeric film.

If the absorbed gaseous impurities in the dielectric films (e.g. $H_2O$) are not removed prior to the metal deposition, they will outgas during the PVD process as a result of the higher temperatures achieved during plasma processes. Consequently, the substrate should be degassed to prevent outgassed impurities from affecting the quality of the PVD metal layer. Tantalum, for example, may form Tantalum oxide in the presence of certain impurities which is not an optimal barrier material to prevent Copper diffusion. In another example, such as for packaging metallization (e.g. UBM applications), if $H_2O$ is not removed prior to a pre clean element (by sputter etch), outgassing of the $H_2O$ will occur leading to the formation of other unwanted oxides, such as Aluminum oxide. Aluminum oxide can form on the aluminum bondpad, giving rise to undesirable high contact resistance.

Thus, there is a continuing need in the art for methods and apparatus which allow for efficient curing of the film while minimizing gas and moisture absorption.

Further, due to the nature of CVD process, the incorporation of impurities, such as from the by-products of chemical reactions or residual gases, will significantly affect the resulting film properties. For example, impurities such as moisture ($H_2O$) and CO can be misincorporated into porous low-k dielectric, which will increase the k value. In a typical semiconductor process flow, PVD metal films are usually deposited on a dielectric layers or a polymetric buffer layer.

If the absorbed gaseous impurities in the dielectric films (e.g. $H_2O$) are not removed prior to the metal deposition, they will outgas during the PVD process as a result of the higher temperatures achieved during plasma processes. Consequently, outgassed impurities can affect the quality of the PVD metal layer. Tantalum, for example, may form Tantalum oxide in the presence of certain impurities which is not an optimal barrier material to prevent Copper diffusion. In another example, such as for packaging metallization (e.g. UBM applications), if $H_2O$ is not removed prior to a pre clean element (by sputter etch), outgassing of the $H_2O$ will occur leading to the formation of other unwanted oxides, such as Aluminum oxide. Aluminum oxide can form on the Aluminum bondpad, giving rise to undesirable high contact resistance.

To avoid outgassing during PVD processing, a degas element (by convection heating) is used prior to preclean and metallization to remove any moisture from the underlying substrate. Standard degas procedures generally include heating of the substrate with the affected layer for a period of time, such that the absorbed gases and impurities can escape without affecting deposition in later elements. The heat is usually generated by resistive heating element or lamp, and then transferred to the substrate and thin films by convection. However, due to the ever increasing porosity of dielectric films, as well as highly moisture adsorbent polymers used in packaging applications, long degas times are generally required to completely remove the moisture from the films. Long degas times limit the productivity of a PVD process. Further, standard thermal processing can easily bring modern films to a temperature which produces oxygen-containing secondary gases or leads to glass transition of the layer.

Thus, there is a need in the art for methods and apparatus which allow for efficient degassing of the film while maintaining heat with the thermal processing ranges of the deposited film.

SUMMARY

In one embodiment, a method for processing a substrate can include positioning a substrate in a processing chamber, the substrate comprising a first surface, depositing an uncured layer comprising a polymer, an epoxy or combinations thereof over the first surface of the substrate and performing a hard-cure of the uncured layer. The hard-cure can include heating at least the uncured layer to a hard-cure temperature, setting the processing chamber to a hard-cure pressure, the hard-cure pressure being under 100 mTorr, directing a source of microwave radiation toward the uncured layer, the source of microwave radiation producing microwave radiation at a frequency selected from a frequency range of less than 7 GHz and delivering the microwave radiation at a variable frequency from the source of microwave radiation to the uncured layer, the variable frequency comprising two or more frequencies selected from the frequency range, the variable frequency changing over a period of time.

In another embodiment, a method for processing a substrate can include positioning a substrate in a processing chamber, the substrate comprising a first surface, depositing an uncured layer comprising a polymer, an epoxy or combinations thereof over the first surface of the substrate, performing a soft-cure on the uncured layer, the soft-cure comprising heating the substrate or the chamber to a soft-cure temperature and setting the chamber to a soft-cure pressure to produce a soft-cured layer from the uncured layer, setting the processing chamber to a hard-cure pressure, the hard-cure pressure being under 100 mTorr, directing a source of microwave radiation toward the soft-cured layer, the source of microwave radiation producing microwave radiation at a selected frequency from a frequency range of less than 7 GHz and delivering the microwave radiation at a variable frequency from the source of microwave radiation to the soft-cured layer to heat at least the soft-cured layer to a temperature, the variable frequency comprising two or more frequencies selected from the frequency range over a period of time.

In another embodiment, a method of processing a substrate can include positioning a substrate comprising a polymer or an epoxy on a substrate support in a processing chamber, the processing chamber comprising a cooling device, maintaining the substrate at a temperature below a thermal degas temperature, directing a variable frequency microwave radiation source to deliver microwave radiation to the substrate, delivering variable frequency microwave radiation to the substrate while maintaining the temperature of the substrate below a thermal degas temperature and removing volatile compounds from the chamber.

In another embodiment, a method of processing a substrate can include positioning a substrate with a polymer layer or an epoxy layer on a substrate support in a processing chamber, maintaining the substrate at a temperature below a thermal degas temperature, directing a variable frequency microwave radiation source to deliver microwave radiation to at least the polymer layer or the epoxy layer and delivering microwave radiation to at least the polymer layer or the epoxy layer at a frequency which changes over short bursts of time while maintaining the temperature of the substrate below the thermal degas temperature.

In another embodiment, a method of processing a substrate can include positioning a substrate in a processing chamber, the substrate comprising a polymer or an epoxy, performing a pulsed microwave process and repeating the pulsed microwave process one or more times until at least one volatile component is removed from the substrate. The pulsed microwave process can include delivering a variable frequency microwave radiation source to the substrate as a first power level until the substrate reaches a first temperature, cooling the substrate to a second temperature and removing the released volatile substance from the processing chamber.

BRIEF DESCRIPTION OF THE DRAWINGS

So that the manner in which the above recited features can be understood in detail, a more particular description of the methods, devices and systems, briefly summarized above, may be had by reference to embodiments, some of which are illustrated in the appended drawings. It is to be noted, however, that the appended drawings illustrate only typical embodiments of the methods, devices and systems and are therefore not to be considered limiting of its scope, for the methods, devices and systems described herein may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein disclose the curing of polymeric films in low pressure environment using microwave technology, hence enabling the integration of curing and degassing processes into a single element. This allows for a single piece of equipment to do both the curing and the subsequent metallization elements, eliminating the need for a separate curing oven/furnace and further preventing a vacuum break between the processes. By curing the polymer film using microwave at low pressure, inline integration with PVD becomes possible, which eliminates the need for a separate degas element. Embodiments of the present application can be better understood with reference to the figures below.

Figure 1:
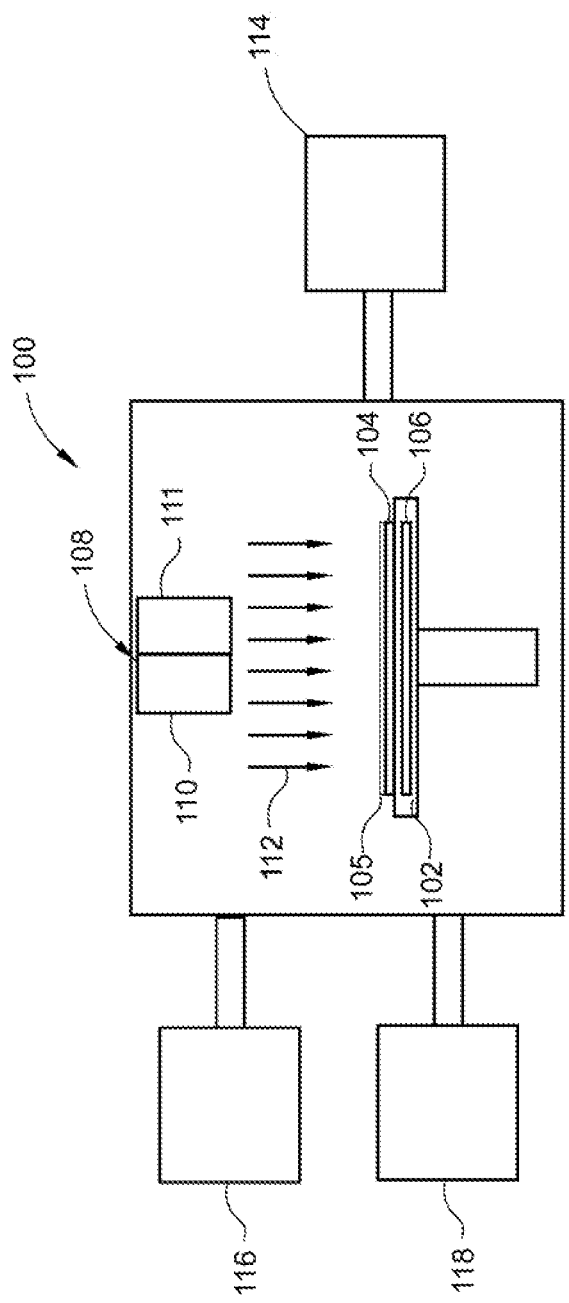
FIG. 1 is a schematic view of a processing chamber, according to one embodiment.

FIG. 1 is a schematic view of a processing chamber 100 adapted to perform one or more of the methods described herein. One or more currently available chambers, such as a PVD chamber, can be adapted for embodiments described below. Chambers useable with embodiments described herein can include the Charger UBM system available from Applied Materials, Inc. located in Santa Clara, Calif. It is envisioned that other chambers, including chambers from other manufacturers, may be used in accordance with the described embodiments without diverging from the disclosed methods, devices and systems.

The processing chamber 100 can include a substrate support 102 for supporting a substrate 104. The substrate support 102 can be composed of standard materials, such as aluminum, quartz, ceramic or stainless steel. Further, the substrate support 102 can be designed to support substrates of any size, such as a 300 mm substrate. Various heating and cooling devices may be embedded in or positioned in connection with the substrate support 102 or the processing chamber 100 so as to deliver heating or cooling to the substrate 104.

The substrate 104 can be any composition useable for semiconductor applications, such as a silicon, epoxy or quartz substrate. The substrate 104 can have a packaging layer 105 deposited thereon. The packaging layer 105 can be a layer which is deposited onto a surface of the substrate 104 which is subsequently cured onto the substrate 104. Packaging layer 105 can be formed by spin-coating a liquid polymer onto a substrate 104. The packaging layer 105 can then be subjected to a curing element to solidify and cross-link the packaging layer 105. The packaging layer 105 may be composed of one of a number of polymers or epoxies, such as polyimides or Polybenzobisoxazole (PBO).

It is to be understood that other deposition techniques for depositing the packaging layer may perform equally well, without diverging from the embodiments described herein. For example, it is envisioned that the packaging layer 105 can be deposited using vacuum lamination of a dry polymer/epoxy film onto the substrate 104. Further embodiments can include deposition of the packaging layer 105 by CVD.

The processing chamber 100 can also have a heat source 106, such as the heat source 106 depicted here as being embedded in the substrate support 102. Though the heat source 106 is depicted in FIG. 1 as being a resistive heat source embedded in the substrate support 102, the heat source 106 may be any heat source applicable to degassing of a substrate or the heating of a chamber, such as an infrared heat lamp heat source. The heat from the heat source 106 may be delivered directly to the substrate 104 or indirectly by changing the temperature of the chamber. The heat source 106 can be designed to heat and maintain the substrate at a stable temperature, such as a temperature between 100° C. and 500° C. The heat source may be of any design and positioned in any position which will allow energy to be delivered for heating the substrate.

The processing chamber 100 may further include a variable frequency microwave radiation source 108. The variable frequency microwave radiation source 108 can include a microwave power source 110. The microwave power source 110 can be selected from all available microwave power sources, including magnetrons, klystrons, gyrotrons, and traveling wave tubes. The variable frequency microwave radiation source 108 can also include a microwave cavity 111. The microwave cavity 111 can be a single mode, multi-mode cavity or combinations thereof. The microwave cavity 111 can receive power from the microwave power source 110.

The variable frequency microwave energy 112 can include continuous sweeping of frequencies over the available frequency range. Continuous sweeping can prevent charge buildup in metal layers, thus reducing the potential for arcing and subsequent damage. Frequency sweeping is often carried out by selecting a center frequency and then rapidly sweeping the frequency in a substantially continuous way over some range. Typically, frequency sweeping can include frequencies in the range of +/−5% of the center frequency, although this range can vary depending on such factors as the type of microwave source and the overall size of the cavity compared to the microwave wavelength.

The frequency range of the variable frequency microwave energy 112 can be a specific range of frequencies, such as a range from 5.85 GHz to 7.0 GHz, such as from 5.85 GHz to 6.65 GHz. In one embodiment, the variable frequency microwave energy 112 is in the range of from 5850 MHz to 6650 MHz. Further, the frequency range can be partitioned into frequencies of a specific interval from one another, such as frequencies selected to be separated by from 200 Hz to 280 Hz. In one embodiment, a 260 Hz separation in frequencies selected from the variable frequency microwave energy can be used, creating 4096 selected frequencies from which the variable frequency microwave energy 112 can be selected. Further, the variable frequency microwave energy 112 delivered during the frequency sweeping can be delivered to the substrate 104 in short bursts of each frequency range selected, such as short bursts of 20 microseconds to 30 microseconds per frequency, for example 25 microseconds.

The processing chamber 100 can further include a gas source 114. The gas source 114 can deliver an inert gas, such as a gas comprising argon or helium. The gas source 114 can deliver gas to the chamber at a specified flow rate based on the size of the chamber and the size of the substrate being processed. The gas source 114 can be directly connected with the chamber or indirectly delivered, such as a noble gas being converted to plasma in a remote plasma source prior to delivery to the chamber. The gas source 114 can be positioned so as to deliver gas over the substrate 104, so as to both cool the substrate 104 and to deliver the selected inert gas.

The processing chamber 100 can also include a plasma source 116. The plasma source 116 can produce plasma from an inert gas, such as from a gas including argon or helium. The plasma source 116 can produce the plasma inside the chamber or the plasma can be produced in a remote source. The plasma source 116 can receive gas flow from the gas source 114 or it may have a separate gas flow (not shown). The inert gas or combination including an inert gas used in the plasma source 116 need not be the same inert gas or combination including an inert gas that is used in the gas source 114. The plasma source 116 can use plasma formed by all available plasma production techniques, including inductively coupled plasma, capacitively coupled plasma or microwave plasma. The plasma source 116 can deliver plasma directed at the substrate 104 or generally to the processing chamber 100.

In embodiments described herein, both curing and degassing of the substrate 104 with a packaging layer 105 occur in the same processing chamber 100 without changing chambers between elements. This reduces adsorption of moisture from the atmosphere thus reducing the processing time required for degassing the substrate 104.

The processing chamber 100 further includes a vacuum source 118. The vacuum source 118 can be applied to both maintain a vacuum, such as during plasma processing and during the cure/degas events, and to remove unwanted byproducts of the degassing, such as byproducts released from the packaging layer 105. The byproducts, such as $C_xO_y$ and $C_xH_y$ gaseous byproducts, can affect further processing as they may be outgassed by the packaging layer 105 during substrate processing, such as during a pre-metallization clean element.

The processing chamber 100 can be fluidly connected to one or more related chambers, such as the pre-metallization clean chamber (not shown). The processing chamber 100 may also be part of a multi-chamber unit (not shown) which includes pre-metallization cleaning and deposition chambers. Using a fluid connection between chambers, especially after degassing, helps prevent further accumulation of $H_2O$ and other impurities.

It is important to note that, though embodiments described herein focus on a packaging layer on a substrate, embodiments described herein are equally applicable to substrates which are formed substantially of polymers or epoxies which need to undergo degas procedures or formed of other heat curable components which are not explicitly named herein.

Figure 2:
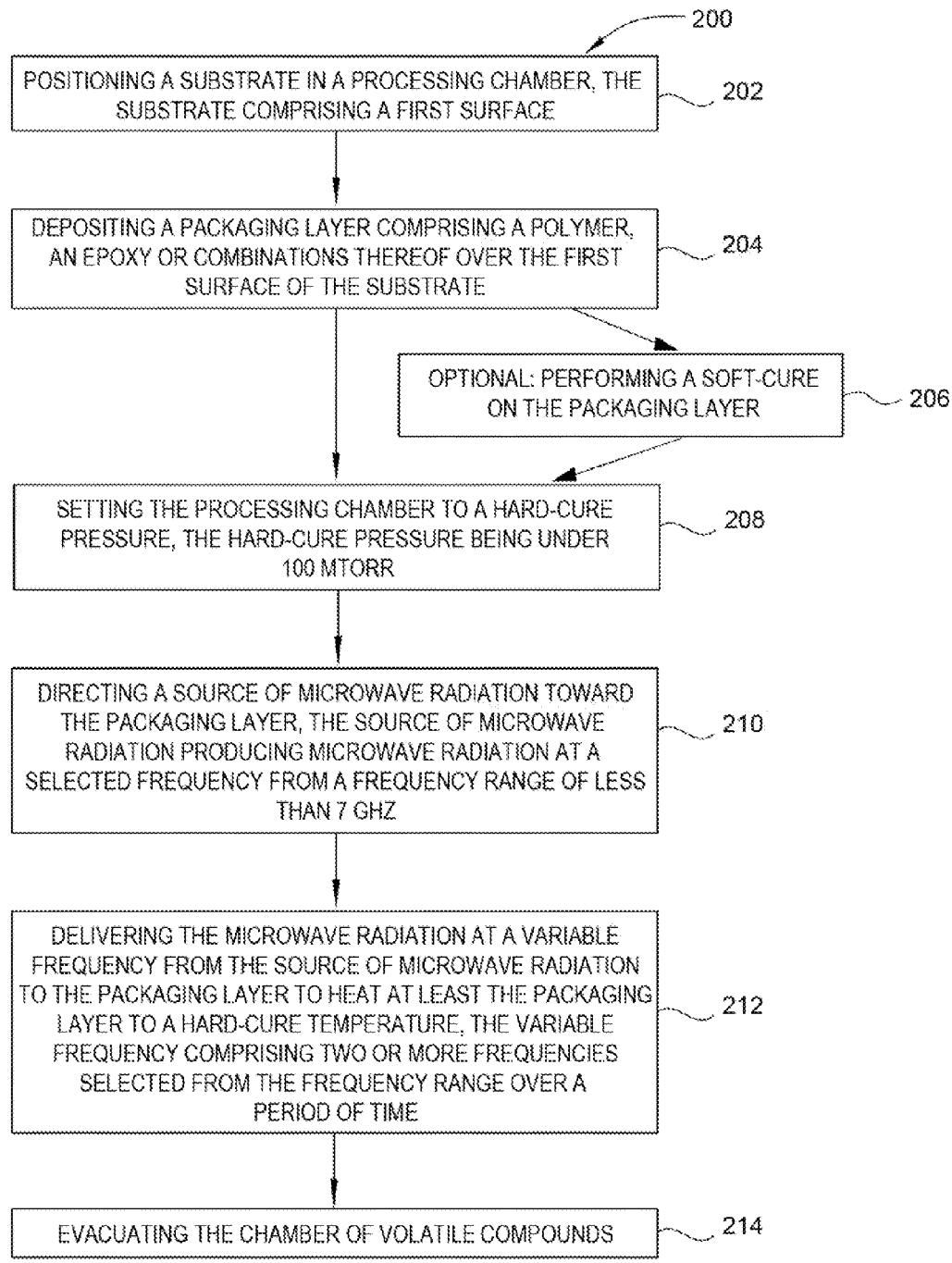
FIG. 2 is a block diagram of a cure and degas method, according to one embodiment.

FIG. 2 is a flow diagram of a method for curing and degassing a packaging layer according to one embodiment. As described herein, packaging layers are exposed to variable frequency microwave The method 200 can begin by positioning a substrate in a processing chamber, as in 202. The processing chamber can be a processing chamber as described above. Further the processing chamber may be part of a multi-chamber unit.

The substrate can include one or more structures or features formed thereon. The substrate can be of any type known in the art, such as a crystalline silicon substrate.

Embodiments can include controlling temperature at the substrate alone or controlling temperature of the processing chamber to control substrate temperature indirectly.

Degassing is well known to be a useful element during the preparation for metallization of portions of a substrate. Among other factors, outgassing during metallization can cause contamination and high resistivity of deposited metal. It is primarily believed that $H_2O$ produces a significant portion of the deleterious effects avoided by degassing a substrate. Surface $H_2O$ is expected to degas at any temperature. Internal moisture will begin to degas at temperatures at or above 50° C. Thus, uniform heat with specific consideration of areas which are not exposed to the surface is important for proper degassing.

A packaging layer is deposited over the first surface of the substrate, as in 204. The packaging layer can include a polymer, an epoxy or combinations thereof. In one embodiment, the packaging layer can comprise at least one of epoxy, silicone, rigid silicone, urethane, oxethane, acryl, polycarbonate, polyimide, and a mixture of at least two of these. The packaging layer can be provided at least to a level or depth that coats or covers the underlying structure.

A soft-cure can be performed on the packaging layer, as in 206. A soft-cure is a process which partially solidifies the packaging layer such that the packaging layer is pliable without being fluid. The soft-cure generally involves a first annealing of the packaging layer. The process conditions of the first annealing, including temperature, pressure, and duration, are selected so that a soft-curing of the packaging layer is achieved. In a soft-cured state, the packaging layer is no longer in a fluid state and is not fully hardened. The process conditions of the first annealing vary with the type of packaging layer and the volume of packaging layer. In one embodiment, a soft-cure of a polyimide layer includes an anneal at 85° C. for 90 seconds followed by an anneal at 95° C. for 90 seconds at standard pressure. In general, a larger volume of packaging layer deposited on the substrate requires a longer annealing time.

In beginning the hard-cure or final cure, the processing chamber can be set to a hard-cure pressure, as in 208. The hard-cure pressure can be under 100 mTorr. The substrate with the packaging layer, either in an uncured or in a soft-cured state, can be set to a hard-cure pressure. The hard-cure pressure is a generally a very low pressure, such as a pressure under 100 mTorr. In one embodiment, the pressure is less than 1 mTorr. In embodiments where the packaging layer is soft-cured, the hard-cure pressure can be the same as the soft-cure pressure.

In one embodiment, a soak stage may be used. During the soak stage, the substrate with the packaging layer is allowed to soak at a second temperature for a period of time prior to further thermal processing. The temperature is increased to a temperature between the soft-cure temperature and below the final cure temperature. In one embodiment, the soak stage employs a temperature between 150° C. and 250° C., such as 200° C. During the soak stage, the temperature is maintained for between 5 and 15 minutes, such as 8 minutes, to reduce stress in the packaging layer during the final cure.

A source of microwave radiation can be directed toward the packaging layer, as in 210. The source of microwave radiation produces microwave radiation at selected frequencies from a frequency range. The frequency range can be less than 7 GHz. The microwave radiation source can be of any design which allows for one or more wavelengths of microwave radiation to be delivered at a varying frequency to the substrate, which can include the embodiments described above. The microwave radiation source can be positioned so as to deliver microwave radiation to the substrate, the packaging layer or combinations thereof. Further the microwave radiation source may be at various angles with reference to the substrate position so long as the packaging layer on the surface of the substrate receives at least portion of the microwave radiation.

The variable microwave radiation raises the temperature to a temperature at which the packaging layer can complete the curing process. In one embodiment, the temperature can be in the range of 300° C. to 400° C., such as 330° C. to 350° C. In another embodiment, the second temperature is 340° C. The temperature is dependent on the properties of the packaging layer. Some layers or composites of layers may require higher or lower temperatures to cure, thus the variable microwave radiation can be adjusted accordingly.

Without intending to be bound by theory, single frequency microwave radiation is inadequate for curing and degassing of substrates prior to metallization. Single frequency microwave radiation can allow energy to accumulate in processed substrates, such as substrates with metal features. The use of a variable frequency microwave energy source can prevent the buildup of energy in the layers of a processed substrate. To prevent arcing within a device, such as a MOS device, and to promote uniform heating of the packaging layer, a variable frequency microwave source may be employed.

The microwave radiation is delivered at a variable frequency from the source of microwave radiation to the packaging layer to heat at least the packaging layer to a hard-cure temperature, as in 212. The variable frequency of the microwave radiation can include two or more frequencies selected from the frequency range over a period of time. The variable microwave radiation can be delivered using the parameters described with reference to FIG. 1.

It is believed that the microwave radiation will substantially reduce the cure time, but will need to be supplemented by direct heating. The dipole molecules are oscillated by the microwave energy. It is this oscillation which creates the internal heat which can be used to reduce $H_2O$ and other adsorbed molecule accumulation in the porous polymer material. As the cure continues, the dipole molecules upon which microwave heating relies, such as $H_2O$, will be escaping from the film. As such, the heating from the microwave radiation will decrease over time and may require supplementation from either direct heating or IR heating to complete the curing process.

Once the packaging layer is cured and degassed, the chamber can be evacuated of volatile compounds prior to further processing, as in 214. During the degassing cure process, compounds which are released during heating, such as $H_2O$ and $CxOy$ compounds from the packaging layer, will accumulate in the processing area. These compounds can re-adsorb during a cool down process or they can interact with other available components, such as exposed metals. Embodiments disclosed herein can employ a removal method, such as creating a vacuum or purging the chamber with an inert gas flow to remove these compounds from the chamber.

The localized heating of the packaging layer allows for both cure and degas to occur simultaneously in the same chamber. In standard curing operations, temperature is applied in a largely indiscriminate fashion. In this way, all objects in the chamber, including the chamber itself, are heated from the surface to inner areas. In newer materials, this can lead to glass transition of the packaging layer and damage to integrated components. For example, polyimide film (PBO) is cured at 350° C. and has a Tg of 375° C., thus the typical degassing cure temperature is less than 350° C. Next generation epoxy resins cure at about 200° C., and have a Tg of around 225° C., providing a maximum degassing cure temperature of less than 200° C. Materials for further generations are expected to have cure temperature of about 110° C., and have a Tg of around 135° C., providing a maximum degassing cure temperature of less than 110° C. Variable microwave radiation, as described above, is believed to heat the packaging layer throughout. Variable microwave radiation is combined with low pressure to reduce the boiling point of volatile chemicals and moisture, thus allowing for a simultaneous cure and degas.

Figure 3:
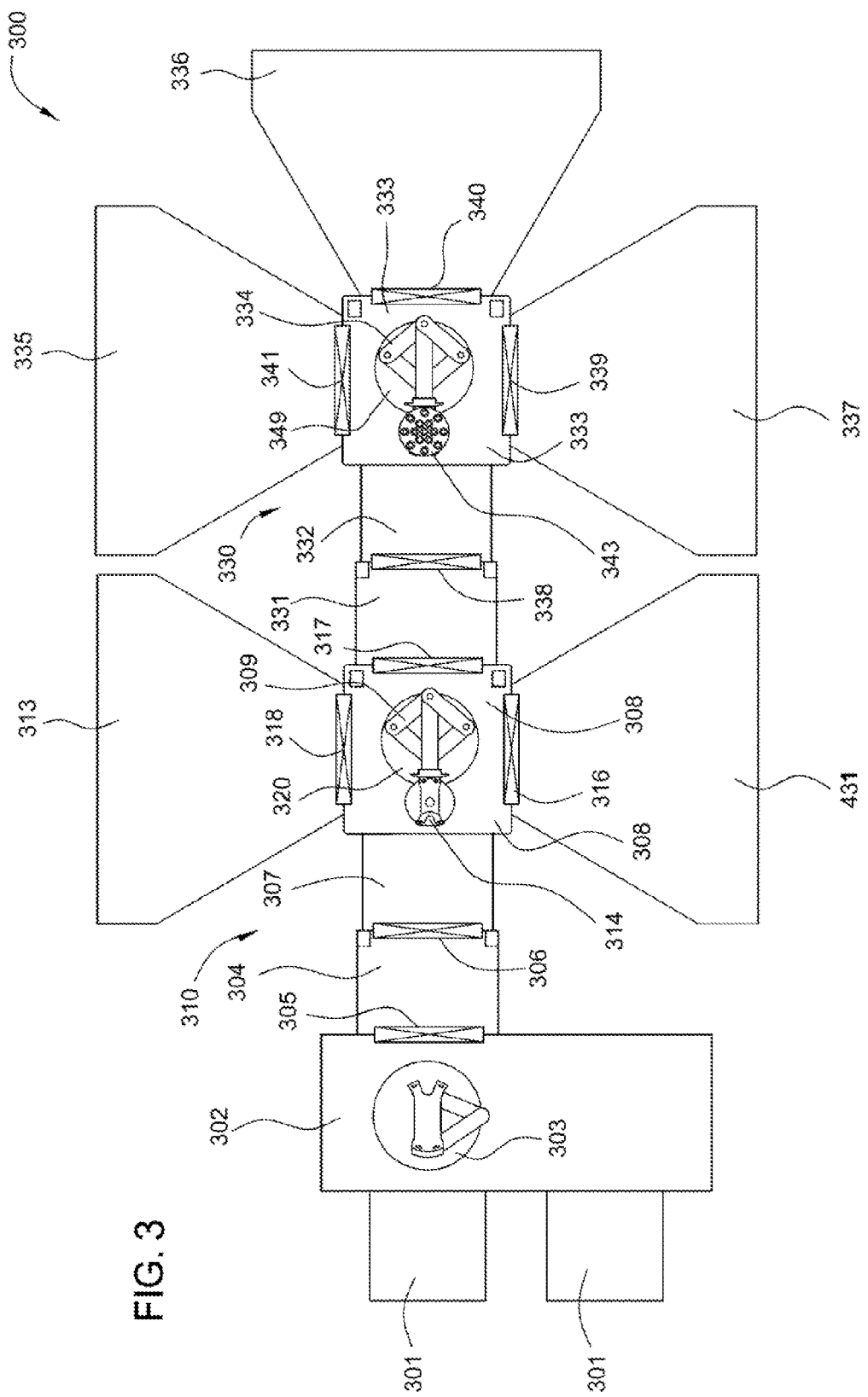
FIG. 3 is a plan view of a vacuum multi-chamber deposition tool, according to one embodiment.

FIG. 3 schematically illustrates a plan view of a vacuum multi-chamber deposition tool 300 in accordance with one embodiment. The vacuum multi-chamber deposition tool 300 comprises multiple processing chambers coupled to a mainframe comprising two transfer chambers 308 and 333.

The vacuum multi-chamber deposition tool 300 comprises a front-end environment 302 in selective communication with a load lock chamber 304. One or more pods 301 are coupled to the front-end environment 302. The one or more pods 301 are configured to store substrates. A factory interface robot 303 is disposed in the front-end environment 302. The factory interface robot 303 is configured to transfer substrates between the pods 301 and the load lock chamber 304.

The load lock chamber 304 provides a vacuum interface between the front-end environment 302 and a first transfer chamber assembly 310. An internal region of the first transfer chamber assembly 310 is typically maintained at a vacuum condition and provides an intermediate region in which to shuttle substrates from one chamber to another and/or to a load lock chamber.

In one embodiment, the first transfer chamber assembly 310 is divided into two parts. In one embodiment, the first transfer chamber assembly 310 comprises a transfer chamber 308 and a vacuum extension chamber 307. The transfer chamber 308 and the vacuum extension chamber 307 are coupled together and in fluid communication with one another. An inner volume of the first transfer chamber assembly 310 is typically maintained at low pressure or vacuum condition during process. The load lock chamber 304 may be connected to the front-end environment 302 and the vacuum extension chamber 307 via slit valves 305 and 306 respectively.

In one embodiment, the transfer chamber 308 may be a polygonal structure having a plurality of sidewalls, a bottom and a lid. The plurality of sidewalls may have openings formed therethrough and are configured to connect with processing chambers, vacuum extension and/or pass through chambers. The transfer chamber 308 shown in FIG. 3 has a square or rectangular shape and is coupled to processing chambers 311, 313, a pass through chamber 331 and the vacuum extension chamber 307. The transfer chamber 308 may be in selective communication with the processing chambers 311, 313, and the pass through chamber 331 via slit valves 316, 318, and 317 respectively.

In one embodiment, a central robot 309 may be mounted in the transfer chamber 308 at a robot port formed on the bottom of the transfer chamber 308. The central robot 309 is disposed in an internal volume 320 of the transfer chamber 308 and is configured to shuttle substrates 314 or substrate carriers 341 among the processing chambers 311, 313, the pass through chamber 331, and the load lock chamber 304. In one embodiment, the central robot 309 may include two blades for holding substrates, each blade mounted on an independently controllable robot arm mounted on the same robot base. In another embodiment, the central robot 309 may have the capacity for vertically moving the blades.

The vacuum extension chamber 307 is configured to provide an interface to a vacuum system to the first transfer chamber assembly 310. In one embodiment, the vacuum extension chamber 307 comprises a bottom, a lid and sidewalls. A pressure modification port may be formed on the bottom of the vacuum extension chamber 307 and is configured to adapt to a vacuuming pump system. Openings are formed on the sidewalls so that the vacuum extension chamber 307 is in fluid communication with the transfer chamber 308, and in selective communication with the load lock chamber 304.

In one embodiment, the vacuum extension chamber 307 comprises a shelf (not shown) configured to store one or more substrates 314. Processing chambers directly or indirectly connected to the transfer chamber 308 may store their substrates on the shelf and use the central robot 309 to transfer them.

The vacuum multi-chamber deposition tool 300 can further comprise a second transfer chamber assembly 330 connected to the first transfer chamber assembly 310 by the pass through chamber 331. In one embodiment, the pass through chamber 331, similar to a load lock chamber, is configured to provide an interface between two processing environments. In this case, the pass through chamber 331 provides a vacuum interface between the first transfer chamber assembly 310 and the second transfer chamber assembly 330.

In one embodiment, the second transfer chamber assembly 330 is divided into two parts to minimize the footprint of the vacuum multi-chamber deposition tool 300. In one embodiment, the second transfer chamber assembly 330 comprises a transfer chamber 333 and a vacuum extension chamber 332 in fluid communication with one another. An inner volume of the second transfer chamber assembly 330 is typically maintained at low pressure or vacuum condition during processing. The pass through chamber 331 may be connected to the transfer chamber 308 and the vacuum extension chamber 332 via slit valves 317 and 338 respectively so that the pressure within the transfer chamber 308 may be maintained at different vacuum levels.

In one embodiment, the transfer chamber 333 may be a polygonal structure having a plurality of sidewalls, a bottom and a lid. The plurality of sidewalls may have openings formed therein and are configured to connect with processing chambers, vacuum extension and/or pass through chambers. The transfer chamber 333 shown in FIG. 3 has a square or rectangular shape and is coupled with processing chambers 335, 336, 337, and the vacuum extension chamber 332. The transfer chamber 333 may be in selective communication with the processing chambers 335, 336, via slit valves 338, 339, 340 respectively.

A central robot 334 is mounted in the transfer chamber 333 at a robot port formed on the bottom of the transfer chamber 333. The central robot 334 is disposed in an internal volume 349 of the transfer chamber 333 and is configured to shuttle substrates 314 or substrate carriers 341 among the processing chambers 335, 336, 337, and the pass through chamber 331. In one embodiment, the central robot 334 may include two blades for holding substrates, each blade mounted on an independently controllable robot arm mounted on the same robot base. In another embodiment, the central robot 334 may have the capacity for moving the blades vertically.

In one embodiment, the vacuum extension chamber 332 is configured to provide an interface between a vacuum system and the second transfer chamber assembly 330. In one embodiment, the vacuum extension chamber 332 comprises a bottom, a lid and sidewalls. A pressure modification port may be formed on the bottom of the vacuum extension chamber 332 and is configured to adapt to a vacuum system. Openings are formed through the sidewalls so that the vacuum extension chamber 332 is in fluid communication with the transfer chamber 333, and in selective communication with the pass through chamber 331.

In one embodiment, the vacuum extension chamber 332 includes a shelf (not shown), similar to that described in connection with the vacuum extension chamber 307 above. Processing chambers directly or indirectly connected to the transfer chamber 333 may store substrates on the shelf.

A substrate carrier such as the carrier 341 may be used with any processing architecture to enable processing of multiple substrates such as the substrates 343 simultaneously. In one embodiment, the substrate carrier may be a thin sheet of a substantially rigid material capable of withstanding the processing environments created by the processes described herein. The carrier may be a glass or silicon platter in some embodiments. In other embodiments, the carrier may be ceramic or a composite material, such as carbon composite. In some embodiments, the carrier may be a platter coated with a process-resistant material, such as a glass-coated or ceramic-coated platter. The carrier may be a 300 mm substrate commonly used in semiconductor manufacturing processes. In some embodiments, the carrier may be shaped to facilitate substrate processing and handling. For example, the carrier may have raised or lowered portions to facilitate manipulating individual substrates disposed on the carrier. In one embodiment, each substrate site on the carrier may have a trench formed around the site to allow a robot with gripping extensions to contact an edge of a substrate disposed on the site. In another embodiment, the carrier may have a depression formed at the center of the substrate site to allow a robot with gripping extensions to contact an inner edge of the substrate having a central opening. In some embodiments, the substrate sites on the carrier may be depressed to prevent substrates from moving on the carrier as the carrier is transported.

Typically, substrates are processed in a sealed chamber having a pedestal for supporting a substrate disposed thereon. The pedestal may include a substrate support that has electrodes disposed therein to electrostatically hold the substrate against the substrate support during processing. For processes tolerant of higher chamber pressures, the pedestal may alternately include a substrate support having openings in communication with a vacuum source for securely holding a substrate against the substrate support during processing.

Processes that may be performed in any of the chambers 311, 313, 335, 336, or 337, include deposition, implant, and thermal treatment processes, among others. In one embodiment, a chamber such as any of the chambers 311, 313, 335, 336, or 337, is configured to perform a sputtering process on a substrate, or on multiple substrates simultaneously. In another embodiment, chamber 311 is a degas chamber as described with reference to FIG. 1. In a further embodiment, the chamber 313 is a pre-metallization clean chamber. The pre-metallization clean chamber of this embodiment uses a sputtering clean process comprising an inert gas, such as argon. In further embodiments, the chamber 335 is a deposition chamber. The deposition chamber used with embodiments described here can be any known deposition chamber.

Tables 1A and 1B depict a comparison between a conventional cure process and a variable microwave frequency cure as described herein. The packaging layer used in the Samples below is a 7 um thick HD4100 photopatternable dielectric film, available from HD Microsystems, Inc. located in Parlin, N.J. The degree of film cure (imidization, cyclization) is generally determined by Fourier transform infra-red (FTIR) spectroscopy analysis on the films. The ratio of the FTIR peak intensities at 1360 $cm^{-1}$ and 1473 $cm^{-1}$ are used for quantitative analysis of polyimide cure as the imide and aromatic peaks at 1360 $cm^{-1}$ and 1473 $cm^{-1}$ are the least contaminated by other absorbances. Thus, the percent imidization (% Imid) denotes the percent that the packaging layer is cured. A soak element can be further incorporated to reduce film stress in the packaging layer.

TABLE 1A

| Sample | Oven | Pressure (Torr) | Stage S1: Soak | | Stage S2: Cure | |
|---|---|---|---|---|---|---|
| | | | Temp (° C.) | Time (min) | Temp (° C.) | Time (min) |
| 1 | — | — | — | — | — | — |
| 2 | c | 7.7e2 | 0 | 0 | 375 | 270 |
| 3 | v | 5.5e2 | 0 | 0 | 340 | 8 |
| 4 | v | 5.0e−4 | 0 | 0 | 340 | 8 |
| 5 | v | 5.0e−4 | 200 | 10 | 340 | 16 |

TABLE 1B

| Sample | S1 + S2 Total Time (min) | FTIR: Peak Intensities ($cm^{-1}$) | | | 1360/1473 | |
|---|---|---|---|---|---|---|
| | | 1009 | 1360 | 1473 | Ratio | % Imid |
| 1 | — | 0.038 | 0.035 | 0.038 | 0.906 | 51.864 |
| 2 | 270 | 0.024 | 0.050 | 0.029 | 1.747 | 100.000 |
| 3 | 8 | 0.023 | 0.056 | 0.032 | 1.724 | 98.640 |
| 4 | 8 | 0.098 | 0.154 | 0.091 | 1.692 | 96.849 |
| 5 | 26 | 0.049 | 0.084 | 0.051 | 1.645 | 94.115 |

Sample 1 depicts a soft-cured polyimide layer. The soft-cured polyimide layer was cured with an anneal at 85° C. for 90 seconds followed by an anneal at 95° C. for 90 seconds at standard atmospheric pressure (760 Torr). The soak element and the cure element were omitted in this sample. The FTIR peak intensities were 0.038 at 1009 $cm^{-1}$, 0.035 at 1360 $cm^{-1}$, and 0.038 at 1473 $cm^{-1}$. The 1360 $cm^{-1}$/1473 $cm^{-1}$ ratio was 0.906 and the % Imid was 51.864.

Sample 2 depicts a fully cured polyimide layer using a conventional oven cure. The fully cured polyimide layer was cured without a soak stage using an anneal at 375° C. for 270 minutes for a total processing time of 270 minutes. The cure was done at 770 Torr. The FTIR peak intensities were 0.024 at 1009 $cm^{-1}$, 0.050 at 1360 $cm^{-1}$, and 0.029 at 1473 $cm^{-1}$. The 1360 $cm^{-1}$/1473 $cm^{-1}$ ratio was 1.747 and the % Imid was 100.000.

Sample 3 depicts a fully cured polyimide layer using a variable frequency microwave cure. The fully cured polyimide layer was cured without a soak stage using an anneal at 340° C. for 8 minutes for a total processing time of 8 minutes. The cure was done at 550 Torr. The FTIR peak intensities were 0.023 at 1009 $cm^{-1}$, 0.056 at 1360 $cm^{-1}$, and 0.032 at 1473 $cm^{-1}$. The 1360 $cm^{-1}$/1473 $cm^{-1}$ ratio was 1.724 and the % Imid was 98.640.

Sample 4 depicts a fully cured polyimide layer using a variable frequency microwave cure. The fully cured polyimide layer was cured without a soak stage using an anneal at 340° C. for 8 minutes for a total processing time of 8 minutes. The cure was done at 0.5 mTorr. The FTIR peak intensities were 0.098 at 1009 cm$^{-1}$, 0.154 at 1360 cm$^{-1}$, and 0.091 at 1473 cm$^{-1}$. The 1360 cm$^{-1}$/1473 cm$^{-1}$ ratio was 1.692 and the % Imid was 96.849.

Sample 5 depicts a fully cured polyimide layer using a variable frequency microwave cure. The fully cured polyimide layer was cured with a soak stage, the soak stage including a temperature of 200° C. for 10 minutes. The cure was completed using a variable frequency microwave radiation anneal at 340° C. for 16 minutes for a total processing time of 26 minutes. The cure was done at 0.5 mTorr. The FTIR peak intensities were 0.049 at 1009 cm$^{-1}$, 0.084 at 1360 cm$^{-1}$, and 0.051 at 1473 cm$^{-1}$. The 1360 cm$^{-1}$/1473 cm$^{-1}$ ratio was 1.645 and the % Imid was 94.115.

Shown here, the variable frequency microwave radiation cured samples achieved a similar level of cure at a rate approximately 30 fold faster than the conventional cure method. Samples 1 and 2 reflect the degree of cure for a conventional soft bake and hard bake respectively. The degree of cure as estimated by % Imid are expected at approximately 50% and approximately 100% respectively. Samples 3 and 4 show the variable microwave frequency at standard and low pressure respectively. Based on the estimated cure level, complete cure was achieved at both standard and low pressure. The addition of the soak stage to the variable frequency microwave radiation cure increased the amount of time expended on the complete cure but it did not significantly affect the level of cure achieved.

Figure 4:
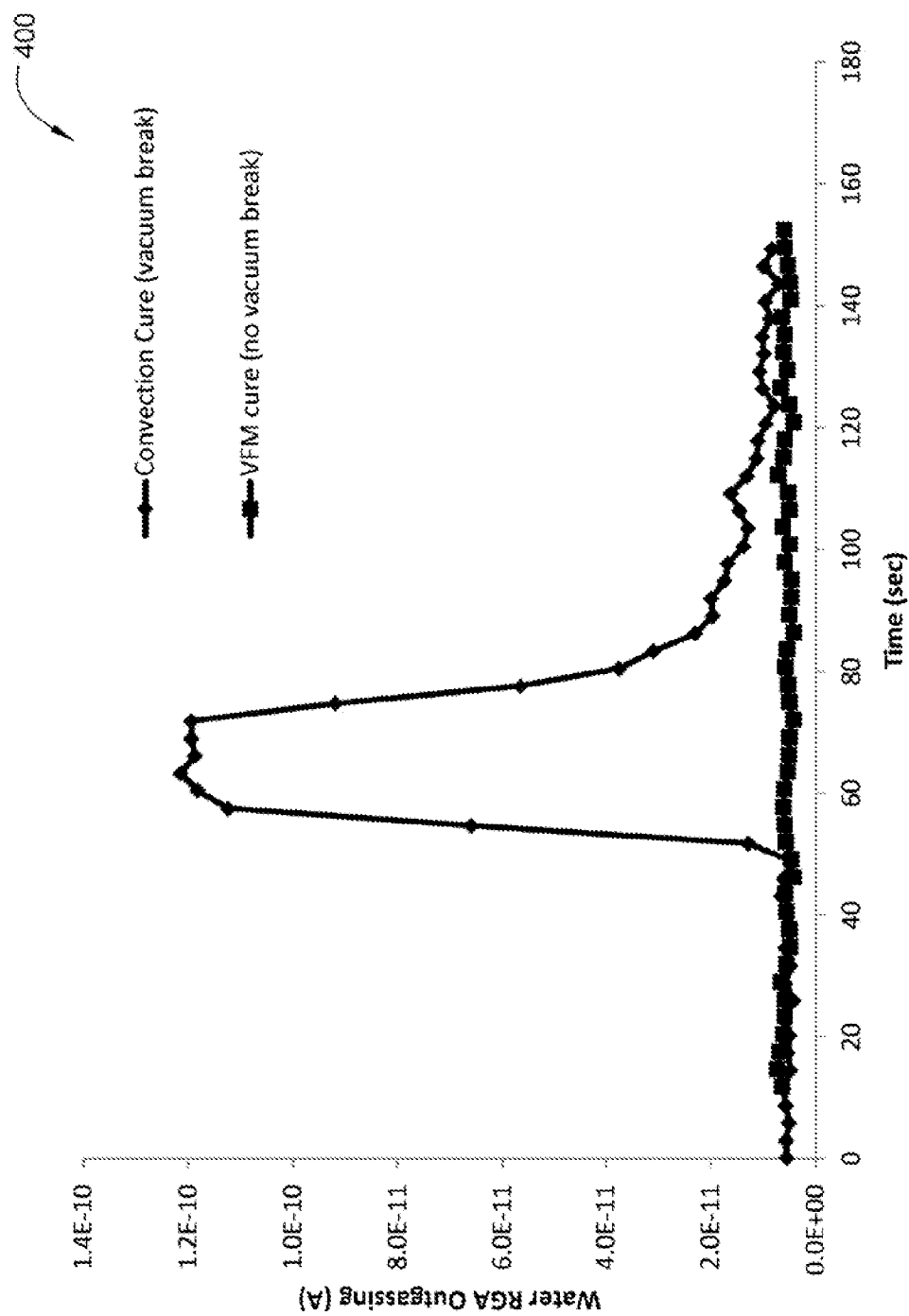
FIG. 4 depicts an outgassing comparison between conventional cure and the degas cure, according to one embodiment.

FIG. 4 depicts an outgassing comparison between conventional cure and the degas cure according to one embodiment. Two substrates were prepared and cured either using a convection thermal cure or a variable frequency microwave cure, as described in the embodiments above. As stated previously, the convection cure includes a vacuum break whereas the variable frequency microwave cure does not. Moisture outgassing from the substrate was determined using a residual gas analyzer (RGA), where outgassing was measured in atomic units (A) over time in seconds.

The convection cure shows moisture outgassing upon the substrate entering the chamber (approximately 50 seconds). Though the wafer was removed at approximately 75 seconds, residual moisture remains in the chamber up to the final time point. The once the maximum moisture outgassing was reached (approximately $1.2 \times 10^{-10}$ A), this outgas level was maintained for the time frame that the substrate was present in the chamber.

The variable frequency microwave cure has no detectable outgassing effect. The wafer entered into the chamber at approximately 50 seconds and exited at 75 seconds, as described in reference to the convection cure substrate. However, the outgassing detected never went above the baseline levels. Further, the baseline levels of the chambers without the substrate are approximately equal. Thus, the degas here shows that the variable frequency microwave cured substrate did not require further degas prior to processing, whereas the convection cure substrate required further degas to remove acquired moisture.

Embodiments described herein relate to methods and apparatus for degassing a substrate. The use of microwave radiation at a low pressure can allow for a lower temperature and higher throughput curing/degassing procedure, which can include both curing and degassing in a single chamber.

Figure 5:
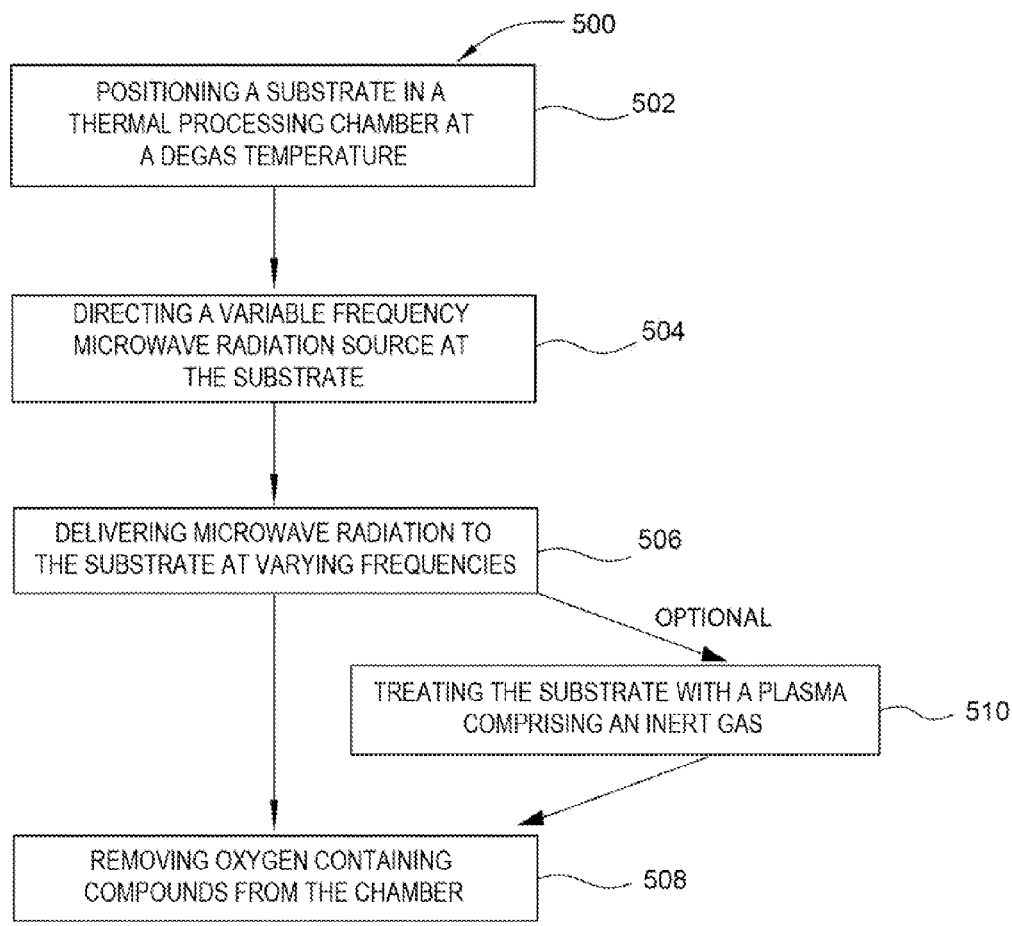
FIG. 5-9 are block diagrams of a method of degassing, according to one or more embodiments.

FIG. 5 is a block diagram of the method 500 according to one embodiment. The method 500 can include positioning the substrate in a thermal processing chamber at a degas temperature, as in 502. The thermal processing chamber can be a processing chamber as described above. Further the thermal processing chamber may be part of a multi-chamber unit. The substrate is positioned on a substrate support with the temperature maintained at the degas temperature. The degas temperature can be specific to the material or at a standard temperature. Embodiments can include controlling temperature at the substrate alone or controlling temperature of the processing chamber to control substrate temperature indirectly.

Degassing is well known to be a useful element during the preparation for metallization of portions of a substrate. Among other factors, outgassing during metallization can cause contamination and high resistivity of deposited metal. It is primarily believed that $H_2O$ produces a significant portion of the deleterious effects avoided by degassing a substrate. Surface $H_2O$ is expected to degas at any temperature. Internal moisture will begin to degas at temperatures at or above 50 degrees Celsius. Thus, uniform heat with specific consideration of areas which are not exposed to the surface is important for proper degassing.

The method 500 can include directing a variable frequency microwave radiation source at the substrate, as in 504. The microwave radiation source can be of any design which allows for one or more wavelengths of microwave radiation to be delivered at a varying frequency to the substrate, which can include the embodiments described above. The microwave radiation source can be positioned so as to deliver microwave radiation to the substrate. Further the microwave radiation source may be at various angles with reference to the substrate position so long as the polymer/epoxy layer on the surface of the substrate receives at least portion of the microwave radiation.

It is believed that the microwave radiation will substantially reduce the degas time, but can benefit from supplementation by direct heating. The dipole molecules are oscillated by the microwave energy. It is this oscillation which creates the internal heat which can be used to reduce $H_2O$ and other adsorbed molecule accumulation in the porous polymer material. As degassing continues, the dipole molecules upon which microwave heating relies, such as $H_2O$, will be escaping from the film. As such, the heating from the microwave radiation can decrease over time. Thus, supplementation from either direct heating or IR heating can help to complete the degas process.

The degas temperature does not necessarily represent standard degas temperatures as the degas process uses both microwave radiation and thermal processing to process the substrate. As such, the chamber temperature may be lower than the substrate localized temperature allowing for quicker cooling of the substrate after processing and avoidance of deleterious effects of overheating the polymer/epoxy layer.

The method 500 can further include delivering microwave radiation to the substrate at varying frequencies, as in 506. After directing the variable frequency microwave radiation source at the substrate, one or more wavelengths of microwave radiation can be delivered to the substrate at varying frequencies. The microwave radiation can be delivered at preselected frequencies of the specific wave length. The frequencies can be selected at random from a list of frequencies or can be chosen in a specific order. Certain materials may be less likely to accumulate energy based on the use of certain frequencies or certain combinations of frequencies. The accumulation of energy can be affected by both the frequencies applied and the wavelength of the microwave radiation used.

Without intending to be bound by theory, single frequency microwave radiation is inadequate for degassing of substrates prior to metallization. Single frequency microwave radiation can allow energy to accumulate in processed substrates, such as substrates with metal features. The use of a variable frequency microwave energy source can prevent the buildup of energy in the layers of a processed substrate. To prevent arcing within a device, such as a MOS device, and to promote uniform heating of the polymer/epoxy layer, a variable frequency microwave source may be employed.

Degassing a substrate to an appropriately low $H_2O$ content while maintaining the integrity of the device requires consideration of a number of factors. Degassing occurs at a specific temperature over a period of time. A higher temperature will reduce the amount of time necessary for degassing. However, since glass transition temperatures (Tg) of the polymer layer are comparatively low, Tg of the layer must be considered in the determination of a proper degas temperature. For example, polyimide film (PBO) is cured at 350 degrees Celsius with a Tg of 375 degrees Celsius, thus the typical degas temperature is less than 350 degrees Celsius. Next generation epoxy resins cure at about 200 degrees Celsius, and have a Tg of around 225 degrees Celsius, providing a maximum degas temperature of less than 200 degrees Celsius. Materials for further generations are expected to have cure temperature of about 110 degrees Celsius, and have a Tg of around 135 degrees Celsius, providing a maximum degas temperature of less than 110 degrees Celsius. By localizing the heating using microwave radiation, the time can be reduced and temperature can be strictly confined through uniform heating at the substrate alone.

The method 500 can further include removing oxygen containing compounds from the chamber, as in 508. During the degas process, compounds which are both accumulated during transfer in the atmosphere, such as $H_2O$, and compounds which are released during heating, such as $C_xO_y$ compounds from the polymer/epoxy layer, will accumulate in the processing area. These compounds can re-adsorb during a cool down process or they can interact with other available components, such as exposed metals. Embodiments can employ a removal method, such as creating a vacuum or purging the chamber with an inert gas flow to remove these compounds from the chamber.

Once the substrate is has reached a sufficient reduction in $H_2O$ and the degassed compounds are removed from the degas chamber, the degassed substrate can be moved to a pre-metallization chamber for sputter or chemical etching to remove surface contaminants before metallization.

Optionally, the method 500 can include treating the substrate with a plasma comprising an inert gas, as in 510. The plasma treatment may be done in the degas chamber or in a separate chamber prior to the preclean and metal deposition chambers/elements. Internal tests have demonstrated that exposure of some polymer materials to a high-density plasma, such as that used in the Isani XT sputter etch chamber available from Applied Materials, Inc. located in Santa Clara, Calif., can result in breakdown of the polymer structure and release of $C_xO_y$ and $C_xH_y$ gaseous by-products. In particular, the oxygen containing by-products can be poisonous to the pre-metallization clean process. By doing a plasma pre-treatment of the polymer in a separate chamber and prior to the pre-metallization clean, process poisoning may be avoided.

The optional plasma pre-treatment can be performed at any element of the degas process, including the degas process described above or other degas processes known in the art. In preferred embodiments, the pre-release process is performed using an argon or helium plasma which is delivered to the surface of the substrate. The plasma can preferably be delivered after the microwave treatment of the substrate and primary degassing has occurred. The plasma can be delivered while maintaining the chamber or the substrate at a degas temperature.

The integration of microwave radiation into the degas chamber may allow an integrated cure to be performed. After the integrated cure is completed, the wafer may proceed to the pre-metallization clean element and subsequent metal deposition elements without exposing the wafer to air. Integrated cure can eliminate the need for a standalone curing furnace and can further result in semiconductor manufacturing cost savings.

Internal tests have shown that the plasma treatment can result in inert pre-metallization gas adsorption in the polymer. The gas desorbs from the polymer after the plasma is extinguished. However, the gas desorption rate controlled in part by wafer temperature. If the wafer is sufficiently cooled, gas will be trapped in the polymer and will slowly desorb. This "pore-sealing" element may help reduce polymer film outgassing during the pre-metallization clean element.

Figure 6:
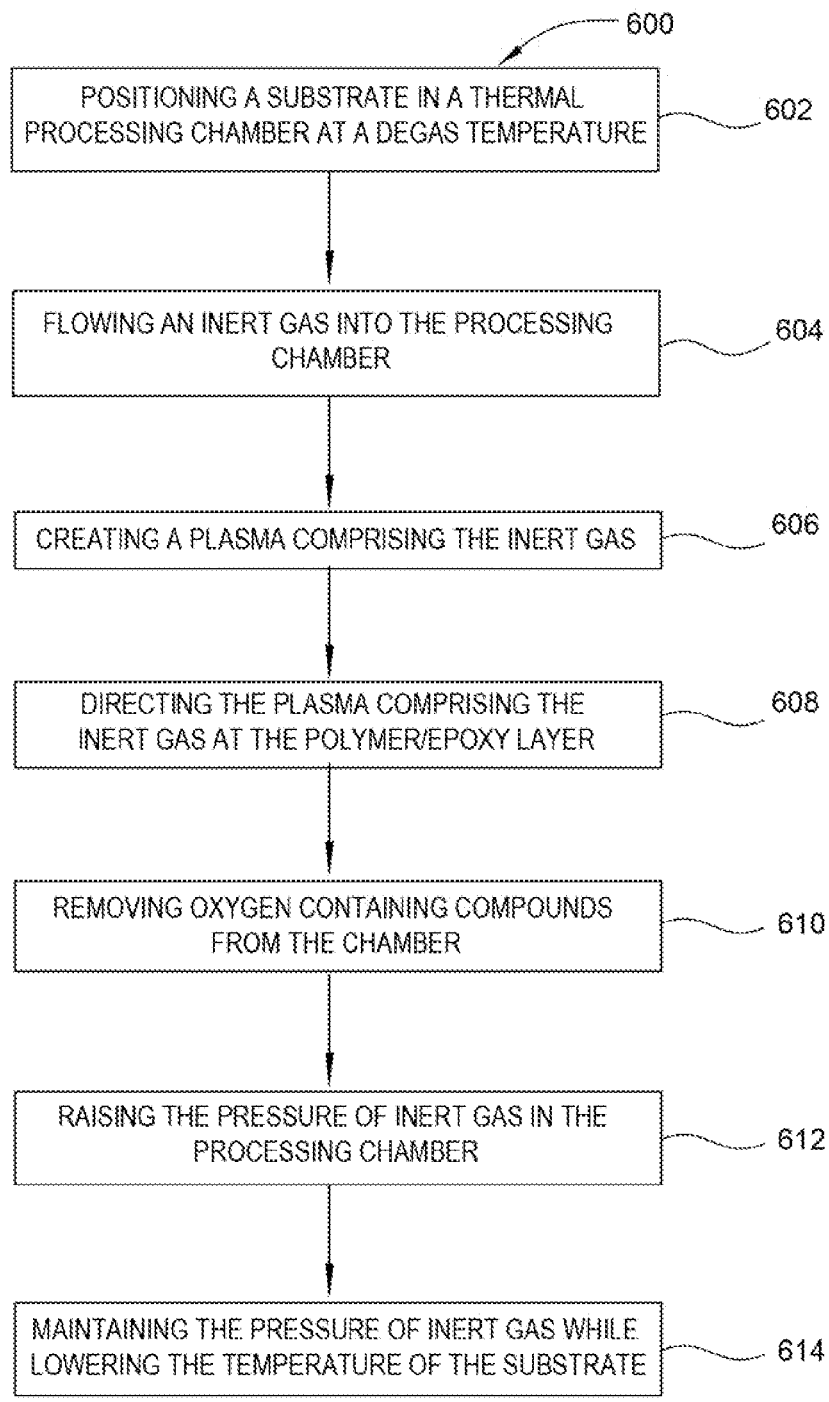

FIG. 6 is a method 600 for processing a substrate according to another embodiment. The method 600 can be used either in conjunction with a standard degas process or with the degas process described above. As well, the method 600 can combine elements of the pre-release plasma treatment described above.

The method 600 can include positioning a substrate in a thermal processing chamber at a degas temperature, as in 602. If this embodiment is combined with embodiments described above, the substrate need not be moved. In preferable embodiments, the substrate would be maintained in the same chamber when combining method 600 with method 500. Though not necessary, preferable embodiments would combine one or more elements of method 600 after completion of degassing in method 500.

The method 600 can further include flow of an inert gas into the process chamber, as in 604. The inert gas provides a non-reactive atmosphere for the degas process, helps prevent interaction between the desorbed gases and the exposed surfaces, and further can be used to assist in the removal of the desorbed gases. The inert gas flowed into the chamber in this element can be flowed directly to the chamber, indirectly in connection with a secondary device, such as through a remote plasma device, or any combination thereof. The inert gas used in embodiments described herein may be any gas which is non-reactive and non-deleterious to the degas process or pre-metallization process, such as a noble gas, for example argon gas or helium.

The method 600 can include creating a plasma comprising an inert gas, as in 606. The plasma can be formed either in the chamber or it may be delivered by a remote plasma source. As discussed previously, the energy source used for the production of the plasma may be any energy source available. The plasma may be inductively coupled, capacitively coupled or microwave plasma. This plasma element may be used for both pre-release, as described above, while simultaneously preparing the surface for pore sealing.

The method 600 can further include directing the plasma comprising the inert gas at the polymer/epoxy layer of the substrate, as in 608. It is believed that the treatment with inert gas plasma opens up spaces in the surface of the polymer/epoxy layer in the position where the plasma by-products are released from. These spaces, as well as preexisting spaces, are filled by the activated inert gas which will outgas from the layer in the presence of heat, such as heat from microwave radiation or ambient heat at a degas temperature.

The method 600 can further include removing oxygen containing compounds from the chamber, as in 610. During the plasma treatment, compounds can be released, such as $C_xO_y$ compounds from the polymer/epoxy layer, which will accumulate in the processing area. These compounds can re-adsorb during a cool down process. Embodiments can employ a removal method, such as creating a vacuum or purging the chamber with an inert gas flow to remove these compounds from the chamber.

Removing the oxygen containing compounds from the chamber at this element is less important if the polymer/epoxy layer has been pre-released using a previous inert gas treatment. Thus, the portion of the embodiment in element 610 may not be beneficial to one or more embodiments described in the present application, if an equivalent element has already been performed previously in relation to the optional pre-release process.

The method 600 can further include raising the pressure of inert gas in the processing chamber, as in 612. The inert gas can be the gas which was used to purge the chamber in the previous element. The inert gas can be one or a combination of any previously applicable inert gas, such as argon or helium. The pressure can be raised to a level where voids formed or preexisting in the surface of the polymer/epoxy layer will be at least partially filled by the inert gas. While raising the pressure of inert gas, the substrate should optimally be maintained at a degas temperature. This can be accomplished, among other ways, with standard heating of the substrate as known in the art or the microwave heating embodiments described herein.

The method 600 can include maintaining the pressure of inert gas while lowering the temperature of the substrate, as in 614. When the pressure has reached a desired level for the polymer/epoxy layer, the temperature can be lowered so as to seal the pores with the newly trapped inert gas. The inert gas is believed to displace gasses which might enter during transfer without harmful effects when outgassing during subsequent processing, such as pre-metallization cleaning. The temperature can be lowered by flowing inert gas into the chamber. By removing external sources of heat, a constant flow of inert gas can be used to maintain pressure while lowering the temperature of the substrate. It is desirable to lower the temperature of the substrate below the degas temperature. Further, the temperature can be lowered with a cooling apparatus in the substrate support or in the chamber, as the design of the chamber permits.

Figure 7:
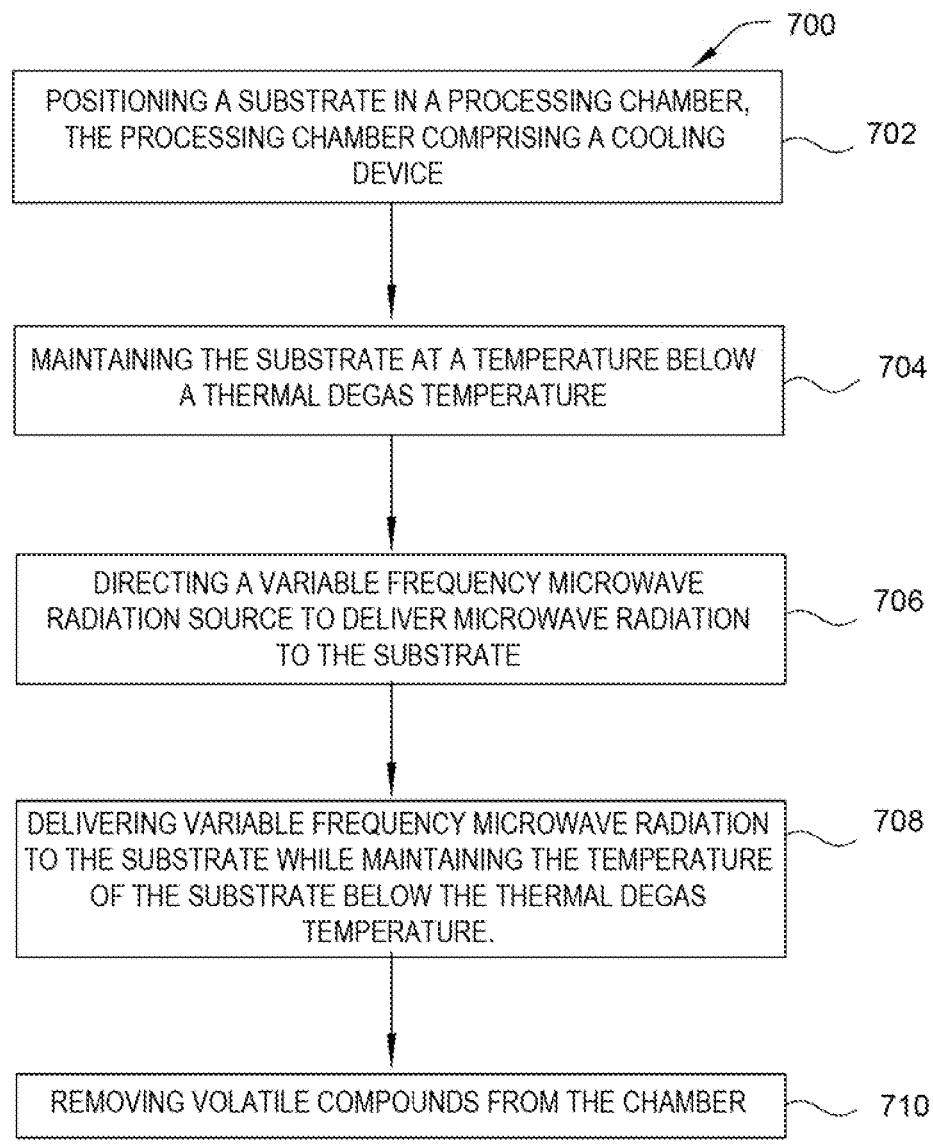

FIG. 7 is a method 700 for processing a substrate according to another embodiment. The method 700 can begin by positioning a substrate in a processing chamber, as in 702. In this embodiment, the processing chamber can include a cooling device, which can be a chamber cooling device or a substrate cooling device. In one embodiment, the cooling device is liquid cooling in the substrate support.

The substrate can be composed of materials as described with reference to FIG. 1. The substrate can have one or more components which can be degassed. The components can include layers or features formed from a polymer, an epoxy or combinations thereof. In one embodiment, the component is a substrate which is sensitive to absorbing moisture from the atmosphere, such as during transfer between chambers. The substrate may be positioned such that the one or more components are positioned distally on the substrate as compared to the substrate support. In chambers where the deposition occurs on the upper surface of the substrate, the one or more components can face upward.

The substrate can be maintained at a temperature below a thermal degas temperature, as in 704. In this embodiment, a thermal degas temperature is a temperature which is used to thermally degas a layer or a substrate. The thermal degas temperature is dependent on the composition of the component in the substrate being processed. In one embodiment, the thermal degas temperature can be from 100 degrees Celsius to 300 degrees Celsius, such as from 100 degrees Celsius to 150 degrees Celsius, for example 100 degrees Celsius. The temperature below the thermal degas temperature can be a separate range which is below the thermal degas temperature described above. In one example, where the thermal degas temperature is 100 degrees Celsius, the substrate can be maintained at a temperature below 100 degrees Celsius. By maintaining the temperature below a thermal degas temperature, conventional thermal processing can be avoided.

A variable frequency microwave radiation source can be directed to deliver microwave radiation to the substrate, as in 706. The variable frequency microwave radiation source can be directed to deliver microwave radiation generally to the substrate or to a specific portion of the substrate. In one example, the variable frequency microwave radiation source is positioned to deliver microwave radiation to a portion or quadrant of the substrate.

Variable frequency microwave radiation can then be delivered to the substrate, as in 708. Once the variable frequency microwave radiation source is positioned, variable frequency microwave radiation can then be delivered to the substrate or the portion thereof. The frequency range, the intervals and the frequency change rate can be as described with reference to FIG. 1. In this embodiment, the substrate is being actively cooled to prevent overheating. The active cooling can allow an increased power input from the variable frequency microwave radiation.

It is believed that increased variable frequency microwave radiation power, in the absence of increased temperature, can allow for adequate processing of a substrate. Molecules with a dipole moment can be directly energized (either for evaporation or other forms of volatilization) by the microwave radiation even as the substrate generally remains cool. In this way, these molecules can be made gaseous and removed from the chamber without potential damage to the substrate.

Volatile compounds can then be removed from the chamber, as in 710. The volatile compounds can be compounds as described above, such as $H_2O$, $H_2$, CO, $CO_2$, $N_2$ or combinations thereof. The oxygen-containing compounds can be removed from the chamber by a number of means, such as by application of a vacuum pump, by flow of an inert gas, combinations thereof or by other means.

Figure 8:
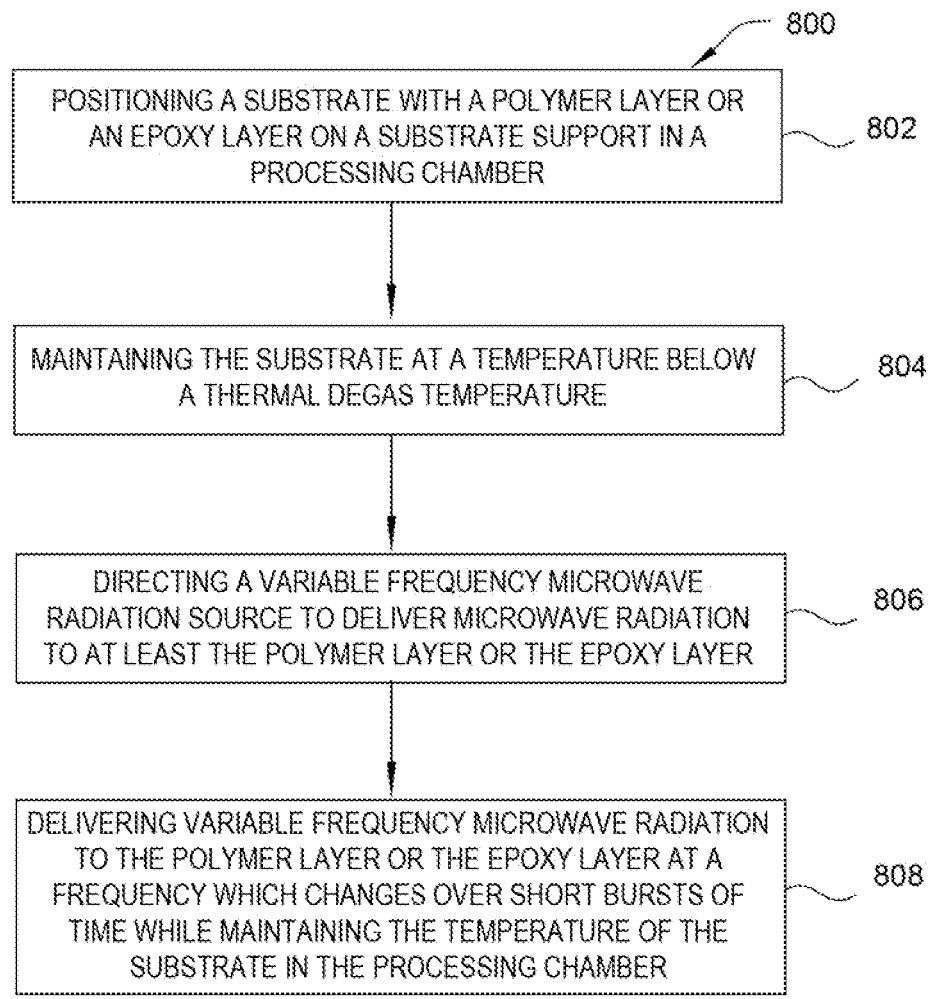

FIG. 8 is a method 800 for processing a substrate according to another embodiment. The method 800 can begin with a substrate with a polymer/epoxy layer being positioned on a substrate support in a processing chamber, as in 802. The substrate positioning and composition can be as described above with reference to FIGS. 1 and 5-7. The polymer/epoxy layer can be any polymer or epoxy which can be used in combination with a substrate as described above. In one embodiment, the polymer/epoxy layer can be as described with reference to FIG. 1. Further, the polymer/epoxy layer may be deposited on a portion of the substrate, a surface of the substrate or all surfaces of the substrate.

The substrate can be maintained at a temperature below a thermal degas temperature, as in 804. The substrate including the polymer/epoxy layer can be maintained at a temperature below a thermal degas temperature. The thermal degas temperature is a temperature as described above with reference to FIG. 7. In one embodiment, the substrate is maintained at a temperature between 100 degrees Celsius and 130 degrees Celsius. The temperature can be maintained below the thermal degas temperature with the use of a cooling device as described with reference to FIG. 7. In another embodiment, the temperature can be maintained below the thermal degas temperature using the ambient temperature of the chamber. Ambient temperature is the temperature of the environment of the chamber, such as a temperature between 20 degrees Celsius and 30 degrees Celsius.

A variable frequency microwave radiation source can then be directed to deliver microwave radiation to at least the polymer/epoxy layer, as in 806. The variable frequency microwave radiation source can be directed to deliver microwave radiation as described with reference to FIG. 7. In one example, the variable frequency microwave radiation source is positioned to deliver microwave radiation to a portion or quadrant of the substrate, based on the location of the polymer/epoxy layer.

Variable frequency microwave radiation can then be delivered to the polymer/epoxy layer at a frequency which changes over short bursts of time, as in 808. The frequency, the time periods and other parameters for the short bursts of time can be as described with reference to FIGS. 1 and 5-7. During the short bursts of time, the temperature of the substrate can be maintained below the thermal degas temperature, as described above. By maintaining the temperature of the substrate below the thermal degas temperature, the degas effect can be delivered primarily by the microwave radiation.

Figure 9:
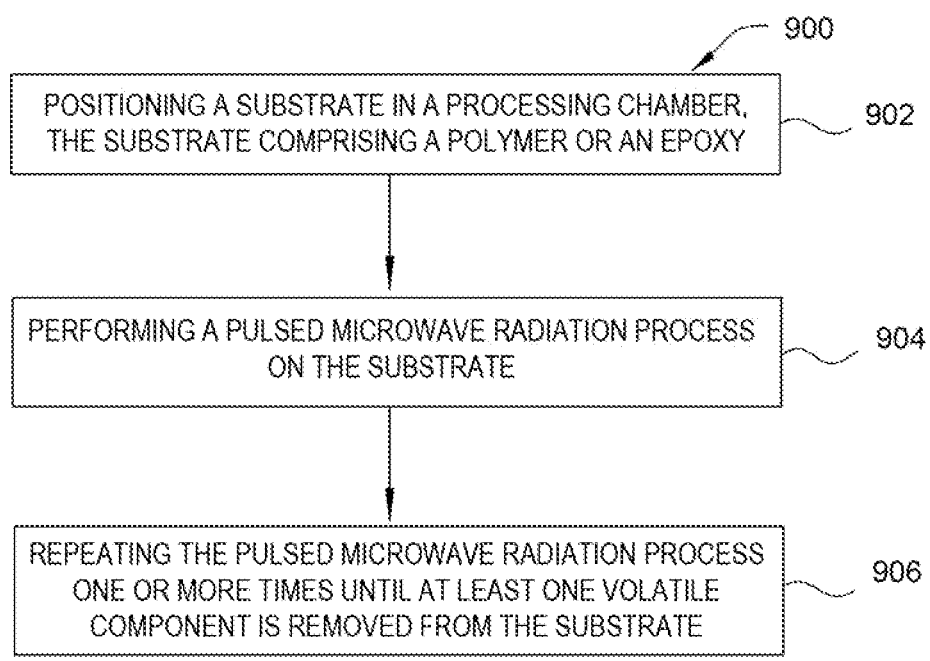

FIG. 9 is a method 900 for processing a substrate according to another embodiment. The method 900 can begin with a substrate being positioned in a processing chamber, as in 902. The substrate can include either a polymer or an epoxy. The substrate positioning and composition can be as described above with reference to FIGS. 1 and 5-7. The polymer and/or the epoxy can be any polymer or epoxy which can be used in combination with a substrate as described above. In one embodiment, the polymer or the epoxy can be as described with reference to FIG. 1. Further, the polymer or the epoxy may be deposited on a portion of the substrate, a surface of the substrate or all surfaces of the substrate.

A pulsed microwave radiation process can be performed on the substrate, as in 904. The pulsed microwave radiation process can include delivering a variable frequency microwave radiation source to the substrate as a first power level until the substrate reaches a first temperature. In this embodiment, the first temperature is a temperature which is less than the thermal degas temperature. The thermal degas temperature is described with reference to FIG. 7. As the variable frequency microwave radiation is delivered to the substrate, the temperature can increase. The degas effect is believed to occur by variable frequency microwave radiation without direct association to temperature. As such, control of the power level may be more important than control of the temperature. Since high temperatures can damage the layers or components on a substrate, the variable frequency microwave radiation can be delivered to the substrate until the substrate reaches the first temperature. The first temperature may be less than the thermal degas temperature, as described with reference to FIG. 7. In one embodiment, the first temperature is between 100 degrees Celsius and 200 degrees Celsius. Further, the delivered microwave radiation necessary to achieve the first temperature may be less than is required for complete hard-curing of the layer and degassing of the substrate.

The pulsed microwave radiation process can further include cooling the substrate to a second temperature. The substrate and affected components can then be allowed to cool to a second temperature. The second temperature can be a temperature between ambient temperature and the first temperature.

The pulsed microwave radiation process can further include removing the released volatile substance from the processing chamber. Volatile substance, such as moisture, can be released during the pulsed microwave radiation process. Other examples of volatile substances can include those listed with reference to FIGS. 1 and 5. Removing volatile substances from the chamber can be done at any point after the substrate is heated, such as during the cooling element or at some point thereafter.

The pulsed microwave radiation process can be repeated one or more times until at least one volatile component is removed from the substrate, as in 906. As the temperature is controlled using equilibration with the environment and the degas effect is believed to be related to the power level of variable frequency microwave radiation delivered, the degas may not be complete when a cycle is finished. As such, the variable frequency microwave radiation can be delivered one or more times, including delivery of a specific power level of variable frequency microwave radiation until a first temperature is reached, cooling of the substrate to a second temperature and either concurrent or subsequent removal of volatile gases. In one embodiment, the process is performed a total of four times. The second temperature can be chosen to allow for a specific amount of power to be delivered before the substrate heats up to the first temperature.

Figure 10:
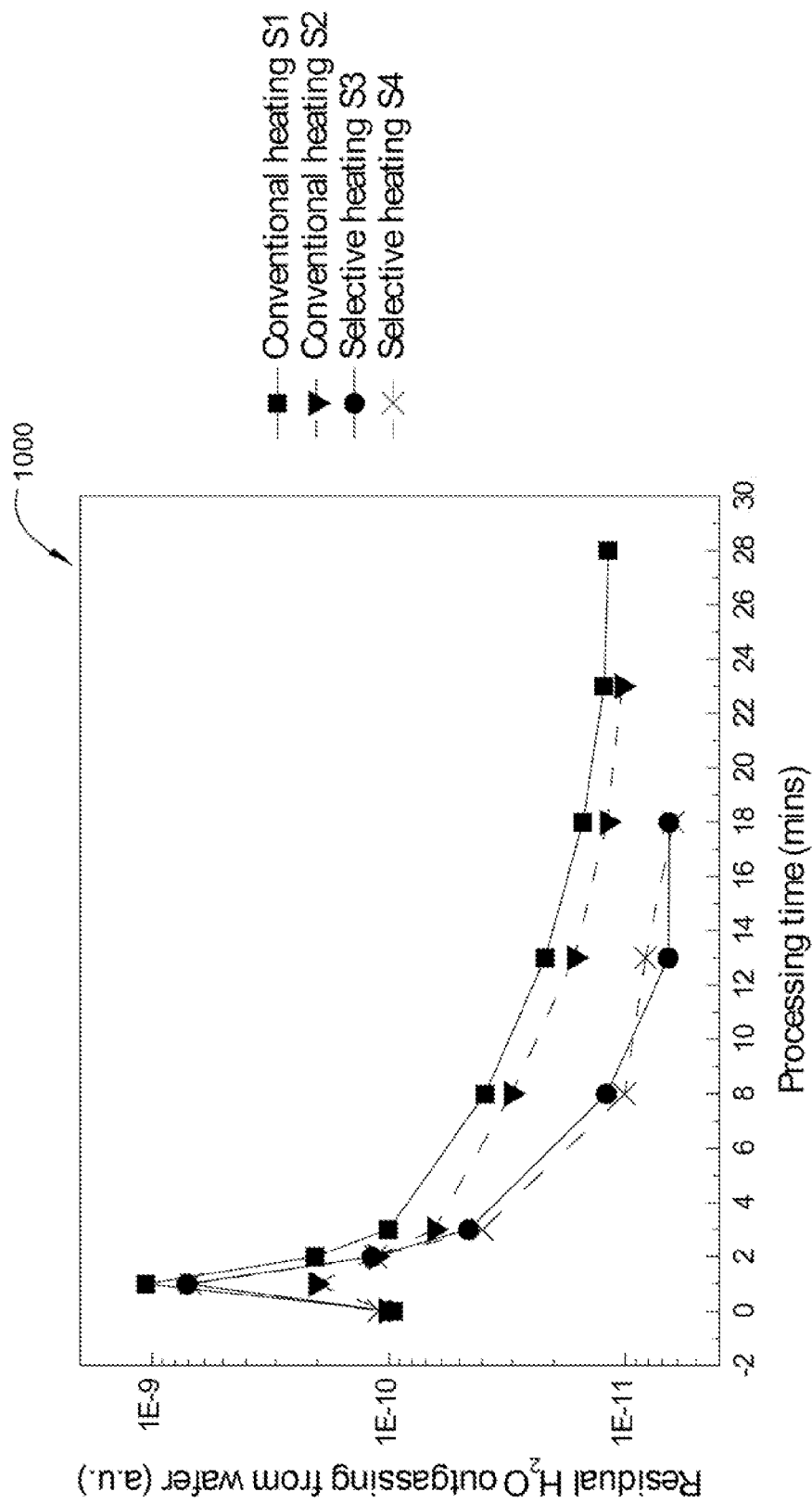
FIG. 10 is a graph of residual outgassing, according to one embodiment.

FIG. 10 is a graph 1000 of residual outgassing as compared to both temperature and microwave power, according to one embodiment. Depicted here is the results of a residual gas analysis (RGA) of microwave processed CVD deposited porous SiO2 thin films. As shown in the graph 1000, two substrates, each with a 2 um thick silicon oxide layer, were exposed to the atmosphere and degassed using a resistive heating method, described in the legend as conventional heating S1 and conventional heating S2. Two independent substrates, each with a 2 um thick silicon oxide layer, were also exposed to the atmosphere and degassed using the variable frequency microwave radiation as described in embodiments above, described in the legend as selective heating S1 and selective heating S2. The residual outgassing is in atomic units and is shown here logarithmically over a period of processing time measured in minutes.

The RGA results of conventional heating processed CVD $SiO_2$ thin films show that, given the same process time, the microwave processed films consistently showed lower residual moisture content than the resistive heating processed films. The moisture removing rate of microwave heating, as measured here, is approximately 3-4 times higher than the resistive heating samples. The 3-4 fold increase is observed for both the observed by time to a fixed moisture level endpoint and by moisture level given a fixed process time endpoint. Further, the final moisture level in the substrate was significantly less in the microwave processed substrate as opposed to the resistive heat treated substrate, indicating an overall better moisture removal.

Figure 11:
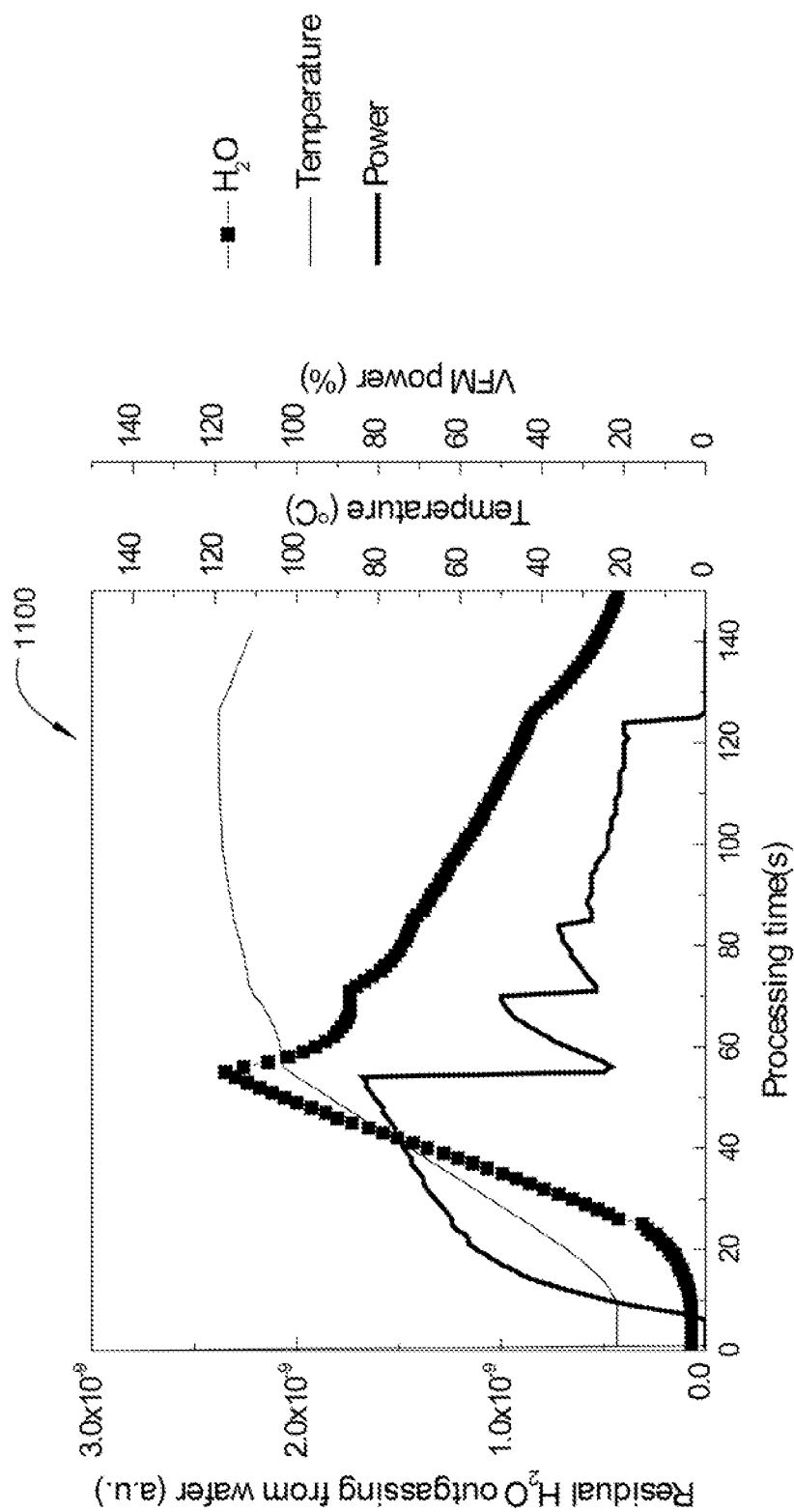
FIG. 11 is a graph of residual outgassing as compared to both temperature and microwave power, according to one embodiment.

FIG. 11 is a graph 1100 of residual outgassing as compared to both temperature and microwave power, according to one embodiment. A substrate with a 2 um thick silicon oxide layer was exposed to the environment and then degassed using embodiments described herein. The graph 1100 shows residual outgassing in atomic units as correlated with temperature in degrees Celsius and variable frequency microwave power as a percentage of the maximum power.

Higher temperature is generally believed to remove moisture faster. Initially, there appears to be a correlation between the temperature and the moisture outgassing, in which the residual outgassing signal increases with the increasing of temperature and microwave power. However, although the temperature keeps increasing, the residual outgassing signal shows a decrease at approximately 55 minutes which correlates with the decrease in microwave power. A spike in outgassing further correlates with the spike in microwave power at 70 minutes, which provides evidence of decoupling of the temperature and microwave effect for degassing applications.

Figure 12A:
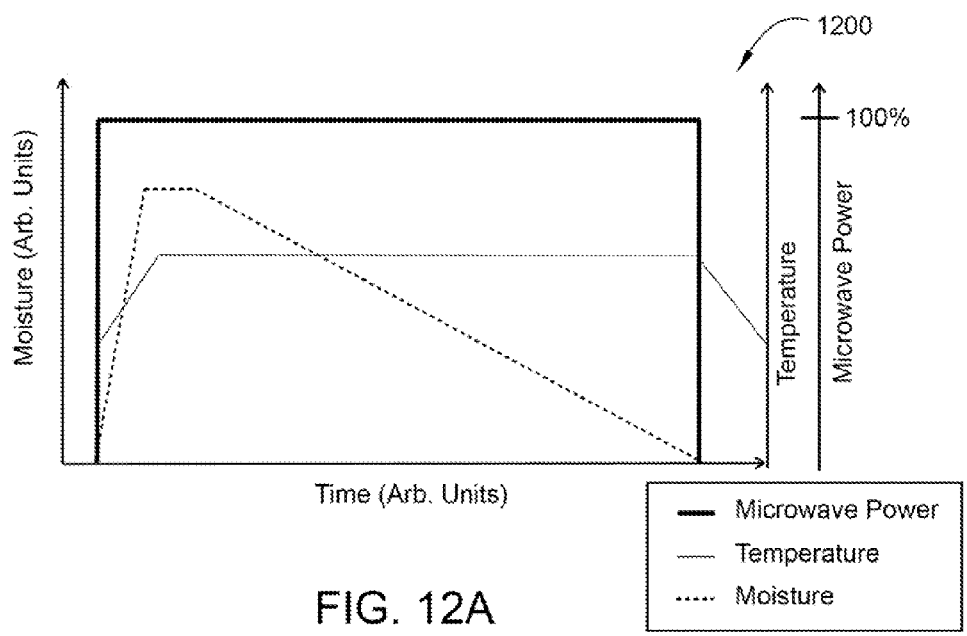
FIG. 12A is a graph of a substrate processing method depicting constant microwave power with maintained temperature, according to one embodiment.

FIG. 12A is a graph 1200 of a substrate processing method depicting constant microwave power with maintained temperature, according to one embodiment. The graph 1200 depicts the variable frequency microwave radiation delivered at a constant power level while maintaining the substrate temperature at a constant level. The substrate temperature is generally maintained at a constant level by an active cooling system. By maintaining the temperature constant, the variable frequency microwave power can be increased, thus reducing the processing time over thermal processing.

Figure 12B:
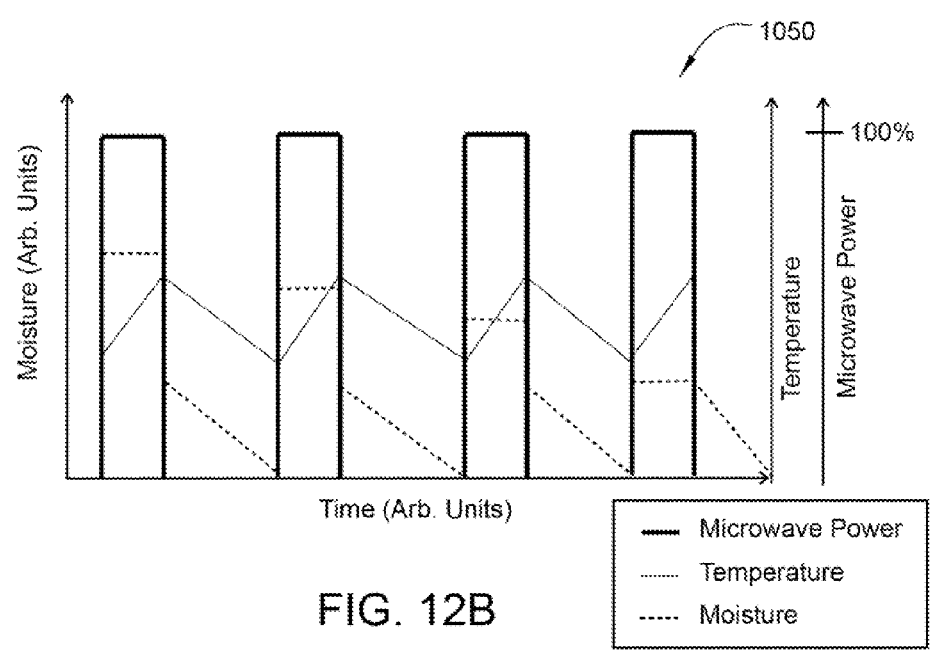
FIG. 12B is a graph of a substrate processing method depicting pulsed microwave power, according to one embodiment.

FIG. 12B is a graph 1250 of a substrate processing method depicting pulsed microwave power, according to one embodiment. In this embodiment, the substrate is passively cooled or cooling is insufficient to keep the temperature under control. As such, as the variable frequency microwave power is delivered to the substrate, the temperature is increased commensurate with the microwave power. Once the substrate is heated to a specific temperature, which can be a maximum temperature for the substrate or the layer, the substrate is allowed to cool to a second temperature. Once the second temperature is reached, the process is repeated until the volatile products are outgassed from the layer or the substrate. This process can be repeated many times to assure proper degas of the substrate and the layer.

Figure 13:
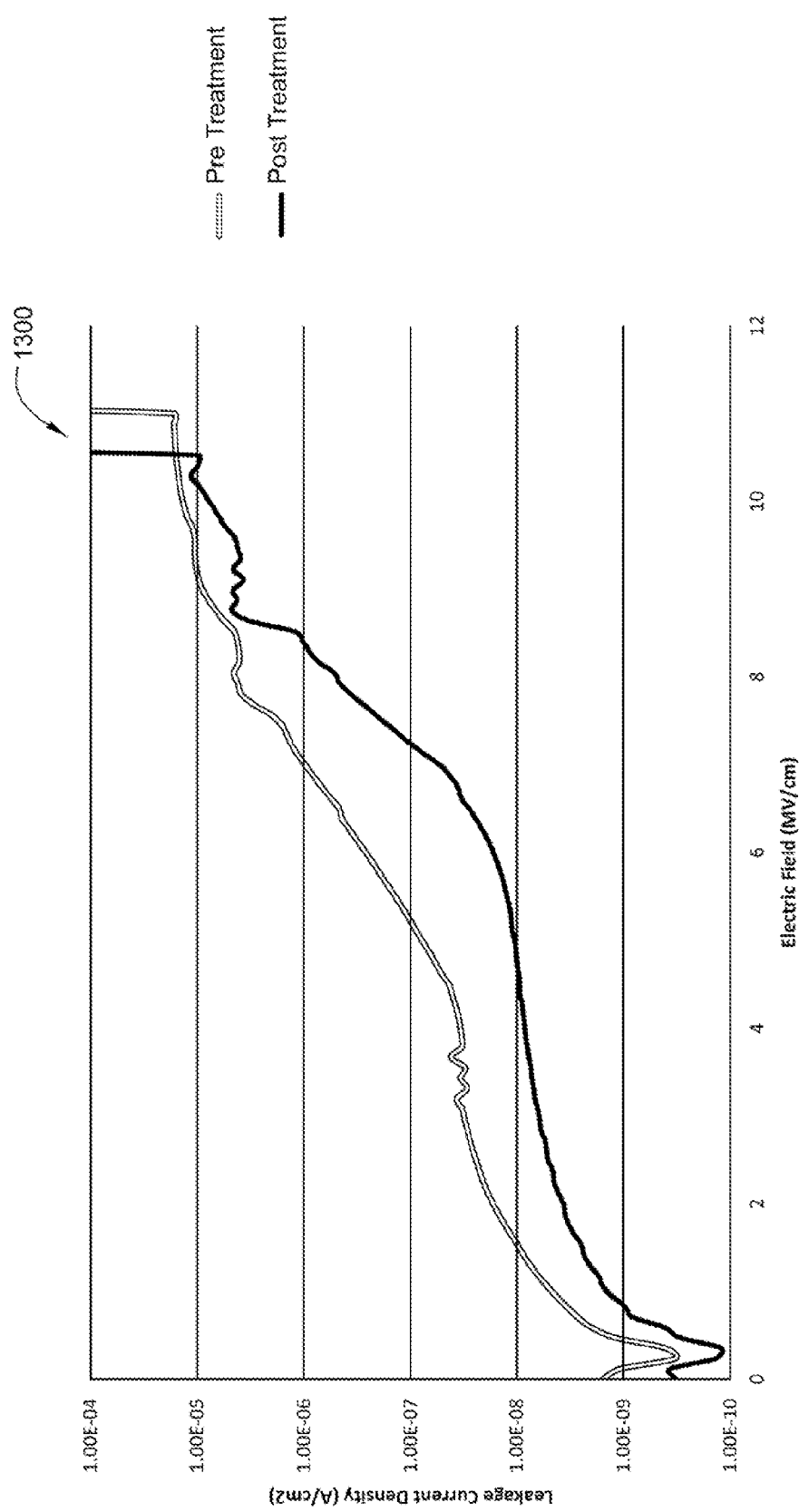
FIG. 13 is a graph depicting leakage current density of a film processed, according to one embodiment.

FIG. 13 is a graph 1300 depicting leakage current density of a film processed, according to embodiments described herein. The graph 1300 depicts leakage current performance of a pre and post variable frequency microwave radiation processed $SiH_4$ film. The leakage current density is shown measured in $A/cm^2$ and the electric field is measured in MV/cm. The graph 1300 shows that the variable frequency microwave treatment improved the leakage current performance by an order of magnitude (approximately 10 fold improvement).

Figure 14:
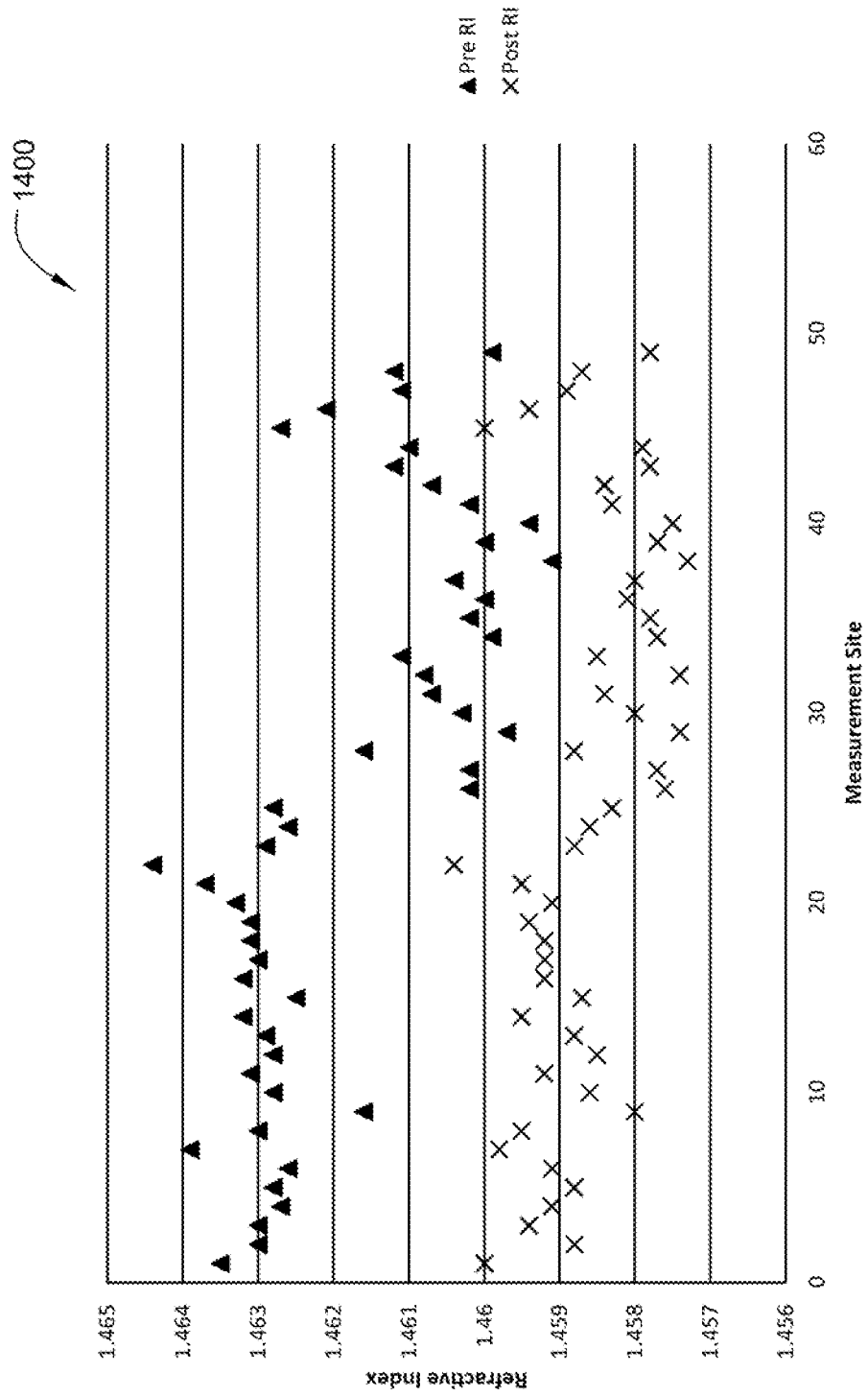
FIG. 14 is a graph depicting change in refractive index of a film processed, according to one embodiment.

FIG. 14 is a graph 1400 depicting change in refractive index of a film processed, according to embodiments described herein. The graph 1400 depicts a 40 point contour map showing the change in refractive index (RI) between a portion of the surface of a substrate both prior to (pre RI) and after (post RI) variable frequency microwave radiation processing. The measurements are performed on the same substrate and at the same measurement sites on the substrate both prior to and after processing. As shown in the graph 1400, the variable frequency microwave processing reduced the refractive index at each point. As well, the processing helped improve uniformity between other measured points on the substrate.

Table 2 depicts a plurality of substrates which include a silicon-containing layer. The silicon-containing layers were processed using the variable frequency microwave radiation method described above. The silicon containing layers were of the same composition and thickness and deposited on similar substrates. The K values were determined both pre-processing and post-processing.

TABLE 2

|  | K Pre | K Post |
|---|---|---|
|  | 5.9102 | 5.4851 |
|  | 5.9123 | 5.4868 |
|  | 5.9287 | 5.4514 |
|  | 5.9691 | 5.4546 |
|  | 5.9869 | 5.4674 |
| K Ave | 5.94 | 5.47 |

The K values of the samples prior to processing (K Pre) were, 5.9102, 5.9123, 5.9287, 5.9691 and 5.9869. The average K value prior to processing was 5.94. The K values of the samples after processing using the methods described above were 5.4851, 5.4868, 5.4514, 5.4546 and 5.4674. The average K value after processing was 5.47. The decrease in K value indicates the decrease in water concentration in the deposited layer.

Embodiments described herein relate to methods and apparatus for degassing a substrate. The use of microwave radiation can allow for a lower temperature and higher throughput degassing procedure than can be achieved from standard thermal degassing units. Further, microwave degassing embodiments can include both curing and degassing in a single chamber. Further, it has been found that gases available to the metallization include both accumulated gases, such as $H_2O$, and produced gases, such as gases which occur after plasma treatment of the polymer/epoxy layer. By employing a pre-release element, a pore sealing element or combinations thereof as part of the degassing of the substrate, both accumulated gases and produced gases may be removed from the substrate prior to pre-metallization clean. Degassing as disclosed above is believed to lead to higher quality metal features during subsequent deposition elements.

One example can include a method of processing a substrate. The method can include positioning a substrate comprising a polymer or an epoxy on a substrate support in a processing chamber, the processing chamber comprising a cooling device. The substrate can then be maintained at a temperature below a thermal degas temperature. Next, a variable frequency microwave radiation source can be directed to deliver microwave radiation to the substrate. Then, variable frequency microwave radiation can be delivered to the substrate while maintaining the temperature of the substrate below a thermal degas temperature. Volatile compounds can then be removed from the chamber.

The method can further include the thermal degas temperature being less than 130 degrees Celsius.

The method can further include the cooling device being formed in connection with the substrate support.

The method can further include the frequency of the variable frequency microwave radiation being in the range from 5.85 GHz to 6.65 GHz.

The method can further include volatile compounds being removed by a vacuum pump, inert gas flow or combinations thereof.

The method can further include the variable frequency microwave radiation being delivered at a power level commensurate with the cooling capacity of the cooling device.

The method can further include the substrate being heated to the thermal degas temperature for a period of time prior to maintaining the substrate at a temperature below the thermal degas temperature.

The method can further include volatile compounds which have a permanent dipole moment.

The method can further include the variable frequency microwave radiation having an interval of change, wherein each frequency after each interval of change varies from each previous frequency by from 200 MHz to 280 MHz.

Another example can include a method of processing a substrate. The method can include positioning a substrate with a polymer layer or an epoxy layer on a substrate support in a processing chamber. The substrate can then be maintained at a temperature below a thermal degas temperature. A variable frequency microwave radiation source can then be directed to deliver microwave radiation to at least the polymer layer or the epoxy layer. Microwave radiation can then be delivered to at least the polymer layer or the epoxy layer at a frequency which changes over short bursts of time while maintaining the temperature of the substrate below the thermal degas temperature.

The method can further include the thermal degas temperature being less than 130 degrees Celsius.

The method can further include the frequency of the variable frequency microwave radiation being in the range from 5.85 GHz to 6.65 GHz.

The method can further include the short bursts of time being from 20 microseconds to 30 microseconds.

The method can further include the variable frequency microwave radiation having an interval of change, wherein each frequency after each interval of change varies from each previous frequency by from 200 MHz to 280 MHz.

The method can further include the substrate being maintained at a temperature between 100 degrees Celsius and 130 degrees Celsius.

Another example can include a method of processing a substrate. The method can include positioning a substrate in a processing chamber, the substrate comprising a polymer or an epoxy. Then, a pulsed microwave process can be performed. The pulsed microwave process can include delivering a variable frequency microwave radiation source to the substrate as a first power level until the substrate reaches a first temperature. The pulsed microwave process can further include cooling the substrate to a second temperature. The pulsed microwave process can further include removing the released volatile substance from the processing chamber. The pulsed microwave process can be repeated one or more times until at least one volatile component is removed from the substrate.

The method can further include the first temperature being between 100 degrees Celsius and 200 degrees Celsius.

The method can further include the pulsed microwave process being repeated at least 4 times.

The method can further include the second temperature being between 20 degrees Celsius and 30 degrees Celsius.

The method can further include the frequency of the variable frequency microwave radiation being in the range from 5.85 GHz to 6.65 GHz.

While the foregoing is directed to embodiments of the methods, devices and systems described herein, other and further embodiments of the methods, devices and systems may be devised without departing from the basic scope thereof, and the scope thereof is determined by the claims that follow.

The invention claimed is:

1. A method for processing a substrate, comprising:
positioning a substrate in a physical vapor deposition chamber, the substrate comprising a first surface;
depositing an uncured layer comprising a polymer, an epoxy or combinations thereof over the first surface of the substrate; and
performing a hard-cure of the uncured layer in the physical vapor deposition chamber, the hard-cure comprising:
heating at least the uncured layer to a degas temperature ranging from about 85 degrees Celsius to about 95 degrees Celsius, the degas temperature being less than a hard-cure temperature for the uncured layer;
setting the physical vapor deposition chamber to a hard-cure pressure, the hard-cure pressure being under 100 mTorr;
directing a source of microwave radiation toward the uncured layer, the source of microwave radiation producing microwave radiation at a frequency selected from a frequency range of less than 7 GHz; and
delivering the microwave radiation at a variable frequency from the source of microwave radiation to the uncured layer to heat the uncured layer to the hard-cure temperature, the variable frequency comprising two or more frequencies selected from the frequency range, the variable frequency changing over a period of time, wherein the degas temperature, the hard-cure pressure and the microwave radiation act in conjunction to produce a cured and degassed layer.

2. The method of claim 1, wherein the hard-cure temperature is between 300° C. and 400° C.

3. The method of claim 1, further comprising depositing a seed layer.

4. The method of claim 1, wherein the hard-cure pressure is less than 1 mTorr.

5. The method of claim 1, wherein the frequency range is from 5850 MHz to 6650 MHz.

6. The method of claim 1, wherein the variable frequency comprises two or more frequencies, each frequency varying from a previous frequency by from 200 MHz to 280 MHz.

7. The method of claim 1, wherein the period of time is between 6 minutes and 10 minutes.

8. The method of claim 1, wherein the variable frequency change occurs during the period of time in a time interval of from 20 microseconds to 30 microseconds.

9. The method of claim 1, further comprising flowing an inert gas into the physical vapor deposition chamber to clear the physical vapor deposition chamber of outgassed substances.

10. A method for processing a substrate, comprising:
positioning a substrate in a physical vapor deposition chamber, the substrate comprising a first surface;
depositing an uncured layer comprising a polymer, an epoxy, or combinations thereof over the first surface of the substrate; and
performing a hard-cure of the uncured layer in the physical vapor deposition chamber, the hard-cure comprising:
heating at least the uncured layer to a degas temperature ranging from about 85 degrees Celsius to about 95 degrees Celsius, the degas temperature being less than a hard-cure temperature for the uncured layer;
setting the physical vapor deposition chamber to a hard-cure pressure, the hard-cure pressure being under 100 mTorr;
directing a source of microwave radiation toward the uncured layer, the source of microwave radiation producing microwave radiation at a frequency selected from a frequency range of less than 7 GHz; and
delivering the microwave radiation at a variable frequency from the source of microwave radiation to the uncured layer to heat the uncured layer to the hard-cure temperature, the variable frequency comprising two or more frequencies selected from the frequency range, the variable frequency changing over a period of time, wherein each of the two or more frequencies varying from a previous frequency by from 200 MHz to 280 MHz, and wherein the degas temperature, the hard-cure pressure and the microwave radiation act in conjunction to produce a cured and degassed layer.

11. The method of claim 10, wherein the hard-cure temperature is between 300° C. and 400° C.

12. The method of claim 10, further comprising depositing a seed layer.

13. The method of claim 10, wherein the hard-cure pressure is less than 1 mTorr.

14. The method of claim 10, wherein the frequency range is from 5850 MHz to 6650 MHz.

15. The method of claim 10, wherein the period of time is between 6 minutes and 10 minutes.

16. The method of claim 10, wherein the variable frequency change occurs during the period of time in a time interval of from 20 microseconds to 30 microseconds.

17. The method of claim 10, further comprising flowing an inert gas into the physical vapor deposition chamber to clear the physical vapor deposition chamber of outgassed substances.

18. A method for processing a substrate, comprising:
positioning a substrate in a physical vapor deposition chamber, the substrate comprising a first surface;
depositing an uncured layer comprising a polymer, an epoxy or combinations thereof over the first surface of the substrate; and
performing a hard-cure of the uncured layer in the physical vapor deposition chamber, the hard-cure comprising:
heating at least the uncured layer to a degas temperature ranging from about 85 degrees Celsius to about 95 degrees Celsius, the degas temperature being less than a hard-cure temperature for the uncured layer;
setting the physical vapor deposition chamber to a hard-cure pressure, the hard-cure pressure being under 100 mTorr;
directing a source of microwave radiation toward the uncured layer, the source of microwave radiation producing microwave radiation at a frequency selected from a frequency range of less than 7 GHz; and
delivering the microwave radiation at a variable frequency from the source of microwave radiation to the uncured layer to heat the uncured layer to the hard-cure temperature, the variable frequency comprising two or more frequencies selected from the frequency range, the variable frequency changing over a period of time, the variable frequency comprising two or more frequencies, each of the two or more frequencies varying from a previous frequency by from 200 MHz to 280 MHz, wherein the variable frequency change occurs during the period of time in a time interval of from 20 microseconds to 30 microseconds, and wherein the degas temperature, the hard-cure pressure and the microwave radiation act in conjunction to produce a cured and degassed layer.

* * * * *

UNITED STATES PATENT AND TRADEMARK OFFICE
CERTIFICATE OF CORRECTION

PATENT NO. : 9,548,200 B2
APPLICATION NO. : 14/322484
DATED : January 17, 2017
INVENTOR(S) : Loke Yuen Wong et al.

Page 1 of 1

It is certified that error appears in the above-identified patent and that said Letters Patent is hereby corrected as shown below:

On the Title Page

Item (72), in Column 1, in "Inventors", Line 4, delete "Milpitas, CA (US);" and insert -- Singapore (SG); --, therefor.

Signed and Sealed this
Twenty-first Day of March, 2017

Michelle K. Lee
*Director of the United States Patent and Trademark Office*